(12) United States Patent
Park et al.

(10) Patent No.: US 10,153,313 B2
(45) Date of Patent: Dec. 11, 2018

(54) UNIT PIXEL FOR IMAGE SENSOR COMPRISING CONTACT PAD CONNECTED TO LIGHT RECEIVING PORTION

(71) Applicant: Kwangsue Park, Suwon-si, Gyeonggi-do (KR)

(72) Inventors: Kwangsue Park, Suwon-si (KR); Byung Il Min, Suwon-si (KR); Dong Wook Nam, Suwon-si (KR)

(73) Assignee: Kwangsue Park, Gyeonggi-do (KR)

( * ) Notice: Subject to any disclaimer, the term of this patent is extended or adjusted under 35 U.S.C. 154(b) by 291 days.

(21) Appl. No.: 15/104,177

(22) PCT Filed: Dec. 12, 2014

(86) PCT No.: PCT/KR2014/012280
§ 371 (c)(1),
(2) Date: Jun. 13, 2016

(87) PCT Pub. No.: WO2015/088281
PCT Pub. Date: Jun. 18, 2015

(65) Prior Publication Data
US 2018/0166482 A1    Jun. 14, 2018

(30) Foreign Application Priority Data

Dec. 13, 2013  (KR) .......................... 10-2013-0155762
Dec. 12, 2014  (KR) .......................... 10-2014-0179460

(51) Int. Cl.
*H01L 27/148* (2006.01)
*H01L 27/146* (2006.01)
(Continued)

(52) U.S. Cl.
CPC .. *H01L 27/14616* (2013.01); *H01L 27/14612* (2013.01); *H01L 27/14621* (2013.01);
(Continued)

(58) Field of Classification Search
CPC ......... H01L 27/14621; H01L 27/14632; H01L 27/14645; H01L 27/14612
See application file for complete search history.

(56) References Cited

U.S. PATENT DOCUMENTS

| 2007/0202674 | A1 | 8/2007 | Cohen et al. |
| 2008/0074145 | A1 | 3/2008 | Sidhu et al. |

(Continued)

FOREIGN PATENT DOCUMENTS

WO    WO 2013-032217 A1    3/2013

OTHER PUBLICATIONS

International Search Report, dated Mar. 18, 2015, received in corresponding International Patent Application No. PCT/KR2014/012280.

*Primary Examiner* — Samuel Gebremariam
(74) *Attorney, Agent, or Firm* — Knobbe Martens Olson & Bear LLP

(57) ABSTRACT

A unit pixel formed on a substrate and configured to convert incident light to an electrical signal to constitute an image sensor provided. A unit pixel includes a source having a source voltage supplied thereto and having a silicide layer for metal contact formed thereabove, a drain spaced apart from the source and having a silicide layer for metal contact formed thereabove, a channel formed between the source and the drain and having a current flowed therethrough, an insulating layer formed above the channel, a light receiving part placed in a light receiving region of the surface of the image sensor and having changes in electrical properties caused by incident light therein; and a floating gate formed above the insulating layer so as to be placed between the source and the drain, configured to be electrically connected with the light receiving part, and configured to control an (Continued)

amount of current flowing through the channel by an electric field generated by the changes in electrical properties.

22 Claims, 19 Drawing Sheets

(51) Int. Cl.
    *H01L 29/788*     (2006.01)
    *H01L 29/78*     (2006.01)
    *H01L 31/0352*     (2006.01)
    *H01L 29/423*     (2006.01)
    *H01L 29/66*     (2006.01)

(52) U.S. Cl.
    CPC .. *H01L 27/14632* (2013.01); *H01L 27/14645* (2013.01); *H01L 27/14665* (2013.01); *H01L 27/14687* (2013.01); *H01L 27/14689* (2013.01); *H01L 29/66613* (2013.01); *H01L 29/788* (2013.01); *H01L 29/7833* (2013.01); *H01L 31/03529* (2013.01); *H01L 29/42368* (2013.01); *H01L 29/665* (2013.01)

(56) References Cited

U.S. PATENT DOCUMENTS

| | | | |
|---|---|---|---|
| 2008/0179640 A1* | 7/2008 | Chuang | H01L 27/14689 257/292 |
| 2010/0314667 A1 | 12/2010 | Nozaki et al. | |
| 2011/0133060 A1 | 6/2011 | Yu et al. | |
| 2013/0056806 A1* | 3/2013 | Kim | H01L 27/14645 257/290 |

\* cited by examiner

UNIT PIXEL FOR IMAGE SENSOR COMPRISING CONTACT PAD CONNECTED TO LIGHT RECEIVING PORTION

CROSS REFERENCE TO RELATED APPLICATION

This application claims the benefit under 35 U.S.C. § 119(a) of Korean Patent Application No. 10-2013-0155762 filed on Dec. 13, 2013 in the Korean Intellectual Property Office, the entire disclosure of which is incorporated herein by reference for all purposes.

BACKGROUND

1. Technical Field

The following description present disclosure relates to an image sensor and more particularly, to a unit pixel of an image sensor having high sensitivity.

2. Description of Related Art

An image sensor is a sensor converting light into an electric signal. Representative image sensors include APS (active pixel sensor) and PPS (passive pixel sensor) using CMOS. The photo diode used in the image sensor accumulates incident light and converts the accumulated light into an electric signal. The general photo diode outputs a low current from a small amount of light and thus has to lengthen the exposure time in order to accumulate sufficient electric charge for processing the signal. Accordingly, it is difficult to apply an image sensor using the general photo diode to a high-speed camera. Moreover, since a small amount of light is incident in a dark surrounding, image generated using this kind of image sensor have an unreliable quality. Although there have been studies about a unit pixel of an image sensor having high sensitivity, the afterimage effect or the memory effect still remains to be resolved.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The following description is to provide a unit pixel of an image sensor having novel structure which can be used to develop various kinds of image sensors.

According to one general aspect, a unit pixel formed on a substrate and configured to convert incident light to an electrical signal to constitute an image sensor is provided. A unit pixel may include: a source having a source voltage supplied thereto and having a silicide layer for metal contact formed thereabove; a drain spaced apart from the source and having a silicide layer for metal contact formed thereabove; a channel formed between the source and the drain and having a current flowed therethrough; an insulating layer formed above the channel; a light receiving part placed in a light receiving region of the surface of the image sensor and having changes in electrical properties caused by incident light therein; and a floating gate formed above the insulating layer so as to be placed between the source and the drain, configured to be electrically connected with the light receiving part, and configured to control an amount of current flowing through the channel by an electric field generated by the changes in electrical properties.

According to one example, the light receiving part and the floating gate are electrically connected through at least one via contact which electrically connects a plurality of metals between the light receiving part and the floating gate. The unit pixel may further include at least one contact pad formed in the light receiving region of the surface of the image sensor, wherein the light receiving part is electrically connected with the floating gate through the contact pad. The silicide layer is formed above the floating gate, and at least one metal among the plurality of metals is arranged to shield the light incident to the floating gate.

According to one example, the light receiving part is widely formed on the unit pixels.

According to one example, the unit pixel may further include a wavelength band selecting filter formed above the light receiving part.

According to one example, the light receiving part may be formed by forming a plurality of light receiving layers of which light wavelengths to detect are different. The plurality of light receiving layers may include: a first light receiving layer configured to receive blue light; a second light receiving layer configured to receive green light; and a third light receiving layer configured to receive red light. The plurality of light receiving layers may further include a fourth light receiving layer configured to receive infrared. The light receiving part may be formed to have a thickness depending on wavelength of light to be detected.

According to one example, the light receiving part may be a floating light receiving part and formed of amorphous silicon or polysilicon, wherein an electric field generated by electron-hole pairs generated by the incident light occurs in the light receiving part. The unit pixel may further include a polarization inducing structure formed on the opposite side of the connection between the light receiving part and the floating gate and configured to accelerate recombination of the electron-hole pairs. According to one example, the light receiving part may be a photovoltaic (PV) sensor in which one end of the light receiving part is electrically connected to the floating gate and the other end is connected to a reference voltage. The unit pixel may further include a reset transistor connected to both ends of the light receiving part and configured to reset the light receiving part. The PV sensor may be PN junction photo diode or thermopile.

According to one example, the light receiving part may be photoconductive (PC) sensor in which one end of the light receiving part is connected to the floating gate and the other end is electrically connected to a constant current source or a constant voltage source. The light receiving part may be a thermistor or a bolometer and be electrically connected to the constant current source. On the other hand, the light receiving part may be reverse bias PN junction photo diode and be electrically connected to the constant voltage source. The unit pixel may further include a capacitor connected to the floating gate and the light receiving part, configured to accumulate electric charges outputted from the light receiving part, and configure to apply the voltage to the gate based on the accumulated electric charge; and a reset transistor configured to reset the capacitor.

According to one example, the light receiving part may be formed of pyroelectric in which one end of the light receiving part is electrically connected to the floating gate and the other end is connected to a reference voltage.

According to one example, the light receiving part may be arranged to be spaced apart from the surface of the image sensor.

According to another general aspect, a unit pixel formed on a substrate and configured to convert incident light to an electrical signal to constitute an image sensor is provided. A unit pixel may include: a light receiving transistor configured to output a pixel current by the incident light; and a select transistor configured to control output of the pixel current, wherein the light receiving transistor comprises: a source having a source voltage supplied thereto and having a silicide layer for metal contact formed thereabove; a drain spaced apart from the source and having a silicide layer for metal contact formed thereabove; a channel formed between the source and the drain and having a current flowed therethrough; an insulating layer formed above the channel; a light receiving part placed in a light receiving region of the surface of the image sensor and having changes in electrical properties caused by incident light therein; and a floating gate formed above the insulating layer so as to be placed between the source and the drain, configured to be electrically connected with the light receiving part, and configured to control an amount of current flowing through the channel by an electric field generated by the changes in electrical properties.

According to one example, a light receiving transistor may be PMOS formed in an N-well formed in the substrate. The light receiving transistor may further include a reset end formed in the N-well and configured to receive a reset signal. The light receiving transistor may further include a N-well bias end formed in the N-well and configured to receive N-well bias voltage.

According to one example, the unit pixel may further include a reset transistor having a source, a drain that are connected to each end of the light receiving part respectively, and a gate that receives a reset signal, wherein the reset transistor shorts the light receiving part when the reset signal is inputted.

According to one example, the substrate may be a P-type substrate, and the light receiving transistor and the select transistor may be NMOS.

According to still another general aspect, a unit pixel formed on a substrate and configured to convert incident light to an electrical signal to constitute an image sensor is provided. A unit pixel may include: a light receiving part placed in a light receiving region of the surface of the image sensor and configured to generate photoelectric current by having changes in electrical properties caused by incident light therein; a capacitor of which one end is electrically connected to the light receiving part and configured to accumulate electric charges by the photoelectric current; a follower amplifier configured to output a pixel voltage corresponding to the electric charge accumulated in the capacitor; and a select transistor configured to control output of the pixel voltage. The light receiving part may be any one chosen from a floating light receiving part, a PV sensor, a PC sensor, and a pyroelectric sensor.

According to one example, the unit pixel may further include a reset transistor connected to one end of the capacitor and configured to reset the capacitor.

According to one example, the unit pixel may further include a transfer transistor connected between one end of the light receiving part and one end of the capacitor and configured to control supply of photoelectric current from the light receiving part to the capacitor.

According to one example, the light receiving part and the floating gate are electrically connected through at least one via contact which electrically connects a plurality of metals between the light receiving part and the floating gate. The unit pixel may further include at least one contact pad formed in the light receiving region of the surface of the image sensor, wherein the light receiving part is electrically connected with the floating gate through the contact pad.

According to one example, the light receiving part may be formed above the plurality of the unit pixels.

According to one example, the unit pixel may further include a color filter placed above the light receiving part.

According to one example, the light receiving part may be formed by forming a plurality of light receiving layers of which light wavelengths to detect are different. The plurality of light receiving layers may include a first light receiving layer configured to receive blue light; a second light receiving layer configured to receive green light; and a third light receiving layer configured to receive red light. The plurality of light receiving layers may further include a fourth light receiving layer configured to receive infrared. The light receiving part may be formed to have a thickness depending on wavelength of light to be detected.

According to one example, the light receiving part may be arranged to be spaced apart from the surface of the image sensor.

BRIEF DESCRIPTION OF DRAWINGS

Hereinafter, the following description will be described with reference to embodiments illustrated in the accompanying drawings. To help understanding of the following description, throughout the accompanying drawings, identical reference numerals are assigned to identical elements. The elements illustrated throughout the accompanying drawings are mere examples of embodiments illustrated for the purpose of describing the following description and are not to be used to restrict the scope of the following description.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Since there can be a variety of permutations and embodiments of the following description, certain embodiments will be illustrated and described with reference to the accompanying drawings. This, however, is by no means to restrict the following description to certain embodiments, and shall be construed as including all permutations, equivalents and substitutes covered by the ideas and scope of the following description.

Figure 1:
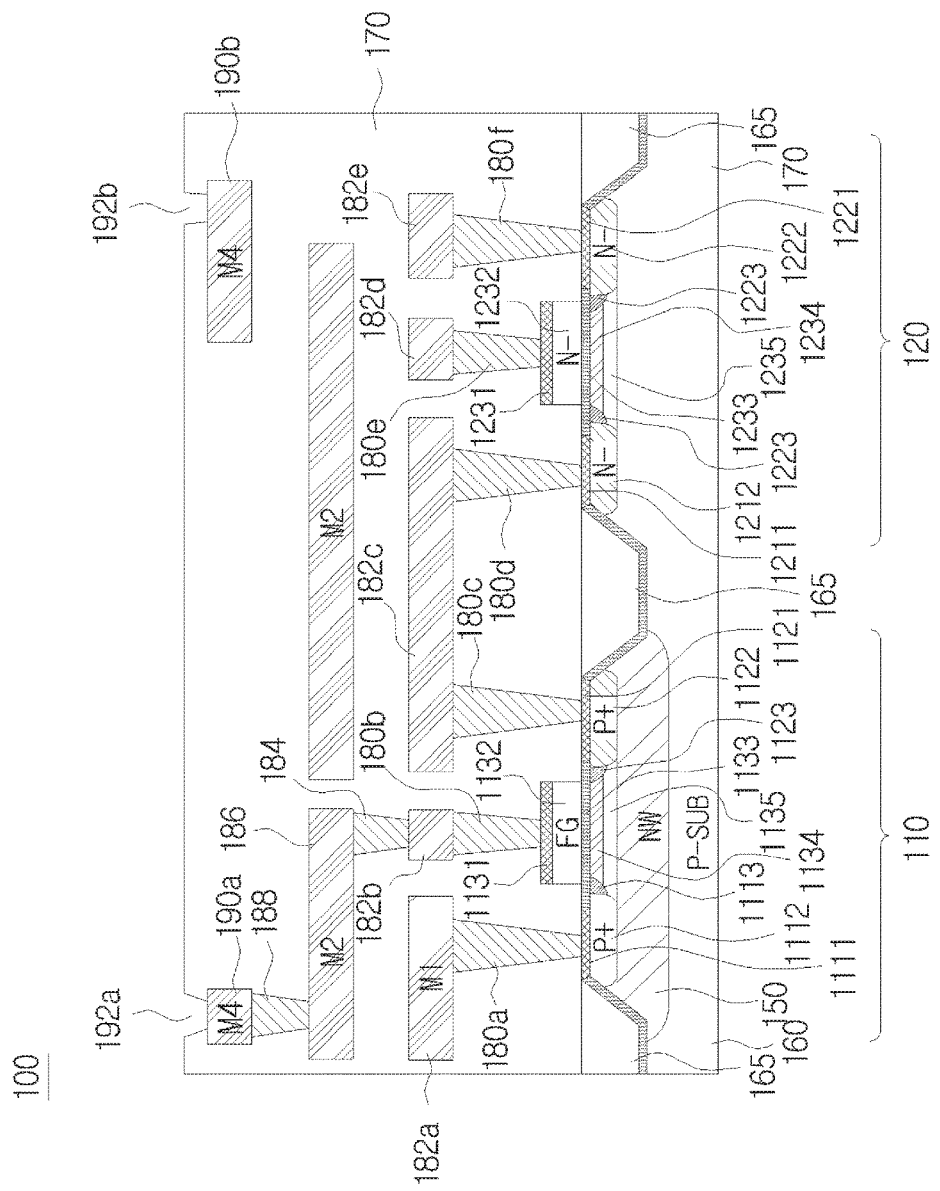
FIG. 1 is a diagram illustrating an example of a unit pixel of an image sensor.

FIG. 1 is a diagram illustrating an example of a unit pixel of an image sensor.

Referring to FIG. 1, a unit pixel 100 performs photoelectric conversion of light to output a pixel current. For this, the unit pixel 100 is constituted with a light receiving transistor 110 for photoelectric conversion of incident light, and a select transistor 120, which is connected to the light receiving transistor 110 to function as a switch. The light receiving transistor 110 may include a light receiving part of which electrical properties are changed when incident light is received, and a transistor including a floating gate connected to the light receiving part to control an amount of pixel current flowing through the channel between the source and the drain by electric field change. The light receiving part is arranged in a light receiving region of the surface of the image sensor. The light receiving part and the floating gate may be electrically connected with each other. The select transistor 120 performs functions of selecting the unit pixel 100 to output a pixel current and determining an exposure time. The select transistor 120 executes a switching operation by an SEL control signal applied to a control gate, and the SEL control signal may be a signal having a greater voltage than a source voltage VDD. The select transistor 120 may be a native transistor having a low Vth or a medium Vt transistor.

The light receiving transistor 110 may be PMOS formed in a N-well 150 formed in a P-type substrate 160. The N-well 150 may be formed by injecting N-type impurities in the P-type substrate 160.

A source and a drain of the light receiving transistor 110 are formed in the N-well 150. A first P+ region 1112 and a second P+ region 1122 are formed by injecting P+ impurities in the N-well 150. The first P+ region 1112 operates as the source of the light receiving transistor 110 and has a source voltage VDD applied thereto. The second P+ region 1122 operates as the drain of the light receiving transistor 110. The source and the drain are elements corresponding to each other and may be formed through the same process. Lightly-doped drains (LDD) 1113, 1123 are formed, respectively, on the right side of the first P+ region 1112 and the left side of the second P+ region 1122. A channel layer 1134 is formed and a carrier separation preventing layer 1135, in which doping concentration is lowered in order to prevent a carrier generated in the channel from entering an adjacent MOS, is formed below the channel layer 1134. An insulating layer 1133 is formed above the channel layer 1134. Silicide layers 1111, 1121 are formed for metal contact above the first P+ region 1112 and the second P+ region 1122. The insulating layer 1133 is formed in between the silicide layers 1111, 1121, and a floating gate 1132 made of polysilicon is formed above the insulating layer 1133.

In an exemplary embodiment, an epitaxial wafer may be used for uniformity of the N-well 150. In the structure shown in FIG. 1, Vt of PMOS is affected by the doping concentration of the N-well 150. Accordingly, if the characteristics of the unit pixel are not uniform in a pixel array for an image sensor, the quality of image may be deteriorated. The epitaxial waver may be used for increasing the uniformity of the characteristics of unit pixels, for example, the uniformity of Vt. Since Vt is proportional to the doping concentration, the doping concentration of the N-well 150 may be adjusted for the operation of the light receiving transistor 110.

The floating gate 1132 is formed above the first P+ region 1112, the second P+ region 1122, and the insulating layer 1133 placed between the first P+ region 1112 and the second P+ region 1122. The floating gate 1132 is formed by depositing polysilicon after having an insulating layer formed above the N-well 150. The silicide layer 1131 is formed above the floating gate 1132 to electrically connect with the light receiving part and shield the light incident to the unit pixel 100, passing through the light receiving part. The left side of the first P+ region 1112 and the right side of the second P+ region 1122 are regions 165 for electrically separating the light receiving transistor 110 from adjacent MOS and may be each formed through, for example, a local oxidation of silicon (LOCOS) or shallow trench isolation (STI) method. A protective layer 170, for example, such as an inter-metal dielectric layer, is formed above the light receiving transistor 110 in order to electrically insulate between a transistor formed on the substrate and metal lines formed thereon. Hereinafter, the protective layer is used for collectively referring an inter-metal dielectric layer, a passivation layer and the like for convenience of explanation.

The select transistor 120 may be NMOS formed in the P-type substrate 160. A source and a drain of the select transistor 120 are formed in the P-type substrate 160. A first N+ region 1212 and a second N+ region 1222 are formed by injecting N+ impurities in the P-type substrate 160. The select transistor 120 is constituted with a control gate 1232 which is formed above the first N+ region 1212 and the second N+ region 1222, formed in the P-type substrate 160, and the insulating layer between the first N+ region 1212 and the second N+ region 1222. The first N+ region 1212 operates as a drain of the select transistor 120 and is connected to the drain 1122 of the light receiving transistor 110. The second N+ region 1222 operates as a source of the select transistor 120 and is connected to a I-V Converter (IVC) to output a pixel current. The source and the drain are elements corresponding to each other and may be formed through the same process. Lightly-doped drains (LDD) 1213, 1223 are formed, respectively, on the right side of the first N+ region 1212 and the left side of the second N+ region 1222. A channel layer 1234 is formed and a carrier separation preventing layer 1235, in which doping concentration is lowered in order to prevent a carrier generated in the channel from entering an adjacent MOS, is formed below the channel layer 1234. An insulating layer 1233 is formed above the channel layer 1234. Silicide layers 1211, 1221 are formed for metal contact above the first P+ region 1212 and the second P+ region 1222. The insulating layer 1233 is formed in between the silicide layers 1211, 1221, and a floating gate 1232 made of polysilicon is formed above the insulating layer 1233.

The control gate 1232 is formed above the first N+ region 1212, the second N+ region 1222, formed on the P-type substrate 160, and the insulating layer 1233 formed between the first N+ region 1212 and the second N+ region 1222. The control gate 1232 is formed by depositing polysilicon, after having an insulating layer 1233 formed above the P-type substrate 160. The silicide layer 1231 is formed above the floating gate 1232 for electrical connection and shield incident light.

Metal lines M1 to M4 182a, 182b, 182c, 182d, 182e (hereinafter, collectively referred to as 182), 186, 190a, 190b may be arranged above the light receiving transistor 110 and the select transistor 120 to apply a control signal to the light receiving transistor 110 and the select transistor 120 to output a pixel current. Here, the metal line M4 is the top metal line. However, it is apparent that the top metal may be changed according to layout or process. The metal lines M1 to M4 182, 186, 190a, 190b may be electrically connected with the light receiving transistor 110 and the select transistor 120 through via contacts 180a, 180b, 180c, 180d, 180e, 180f (hereinafter, collectively referred to as 180), 184, 188). The via contact may be formed by forming a protective layer 170 with a height of from one metal line to another metal line and then etching to connect from the surface of the protective layer 170 to each silicide layer 1111, 1121, 1131, 1211, 1221, 1231.

After forming the metal lines M1 to M4 182, 186, 190a, 190b, the protective layer 170 may be formed to cover the top metal line M4. Here, at least a portion of metal lines, which is not used for transmission of control signals among the top metal lines, is used as a contact pad 190a to electrically connect between the light receiving part and the floating gate 1132. A plurality of contact pads 190a may be formed in a light receiving region of the surface of the image sensor according to a type of the light receiving part and/or a type of the light receiving transistor. Here, the light receiving region of the surface of the image sensor is the upper part of the protective layer 170 which covers the top metal line M4, and the light receiving region is at least a portion of the surface of the image sensor in which the light receiving part is formed. In an embodiment, the contact pad 190a is covered by the protective layer 170 and an opening 192a may be formed above the contact pad 190a through an etching process to later form the light receiving part. When the contact pad 190b operates as a polarization inducing structure formed below the light receiving part, an opening 192b is not formed thereon. When the polarization inducing structure is formed above the light receiving part, the contact pad 190b may be used to connect the polarization inducing structure. The contact pad 190b is used to apply a source voltage VDD or a ground voltage GND to the polarization inducing structure.

The metal lines M1 to M4 182, 186, 190a, 190b may have functions of preventing light from being incident to the light receiving transistor 110 and/or the select transistor 120. Since the floating gate 1132 of the light receiving transistor 110 operates by the minutest voltage change, it may be affected by the electron-hole pair (EHP) generated by the incident light. Thus, a part of the metal lines, for example, the metal line M2 186 and/or the M3 not shown), which is not used for pathway of a control signal, may be widely formed above the light receiving transistor 110 and/or the select transistor 120 to shield light. Here, the metal line M2 186 and/or the M3 not shown) may be at least wide enough to shield the light incident to the floating gate 1132 and/or the control gate 1232.

The floating gate 1132 is connected to the metal line, which is not used for transferring a control signal, through via contacts in order to be electrically connected with the light receiving part placed in the light receiving region. It is illustrated in FIG. 1 that the metal lines M1 182b, M2 184, and M4 190a are connected through the via contacts 180b, 184, 188. Here, the floating gate 1132 and the light receiving part may be connected by the shortest path to minimize resistance.

Figure 2:
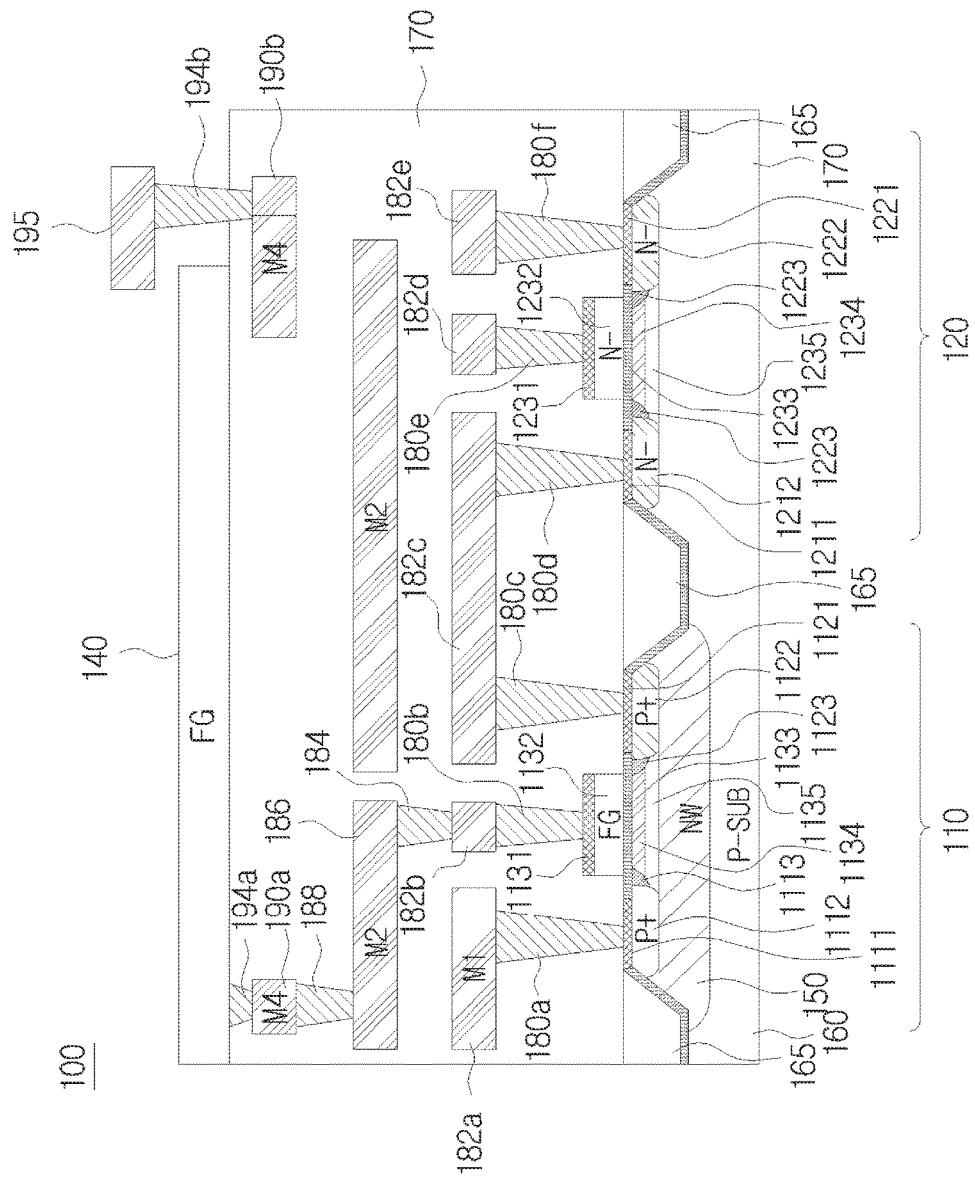
FIG. 2 is a diagram illustrating a cross section of a unit pixel of an image sensor in which a light receiving part is connected to the unit pixel shown in FIG. 1.

FIG. 2 is a diagram illustrating a cross section of a unit pixel of an image sensor in which a light receiving part is connected to the unit pixel shown in FIG. 1.

A unit pixel 100 in FIG. 2 further includes a light receiving part 140 connected through a contact pad 190a, compared to that in FIG. 1. Electrical properties of the light receiving part 140 are changed by incident light. The light receiving part 140 may be formed in a variety of forms depending on the wavelength of light to be detected. The light receiving part 140 may be electrically connected to the floating gate 1132 of the light receiving transistor 110 formed on the substrate 160 using the contact pad 190a.

Therefore, it is not needed to implement individual unit pixel depending on the wavelength of light to be detected. Furthermore, the area to receive the incident light increases since the light receiving part 140 is placed in the light receiving region of the surface of the image sensor. This may increase sensitivity of the image sensor. It is not needed to arrange metal lines, which transfer control signals, complicatedly to increase an amount of incident light.

The light receiving part 140 is formed by depositing amorphous silicon (a-Si:H) or polysilicon and floated. The floating light receiving part 140 may be doped by injecting the same kind of impurities used for the floating gate 1132. A polarization inducing structure 195 may be formed above the other side of the floating light receiving part 140. A lower portion of one side of the floating light receiving part 140 is electrically connected with the floating gate 1132 of the light receiving transistor 110, for example, through the via contact 194a. The polarization inducing structure 195 is electrically connected with the contact pad 190b formed on a lower portion of the other side of the floating light receiving part 140, for example, through the via contact 194b. The floating light receiving part 140 may be covered by a protective layer and a wavelength band selecting filter, for example, such as a color filter, a low pass filter, a high pass filter, or a band pass filter, which is able to select a wavelength band of incident light, may be formed thereabove. An incident angle controlling structure may be also formed above the protective layer.

It is possible to form a polarization inducing structure, which facilitates a polarization phenomenon using the metal around the floating light receiving part 140. The polarization inducing structure may affect an electric field of an upper right portion of the floating light receiving part 140, and may not be in contact with the floating light receiving part 140 to provide electric field effect. When light is incident and electric signal is outputted from the unit pixel, the polarization inducing structure 195 is connected to ground voltage GND to allow holes to be aggregated at the upper right portion of the floating light receiving part 140 through the contact pad 190b. In contrast, when light is not incident or the amount thereof is reduced, the polarization inducing structure 195 is connected to VDD and push the holes to the lower left portion of the floating light receiving part 140 to increase the recombination rate and combination speed of electron hole pairs.

Figure 3:
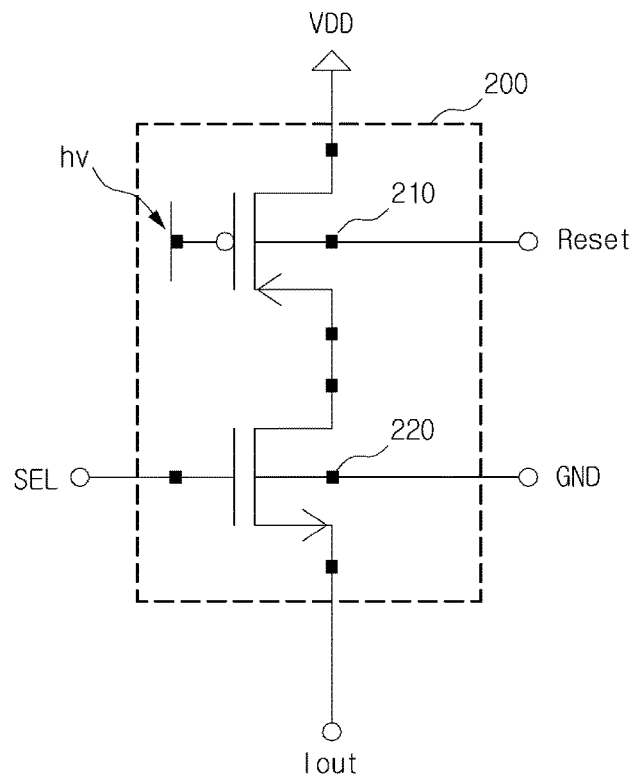
FIG. 3 is a diagram illustrating an example of a circuit of a unit pixel of an image sensor.

FIG. 3 is a diagram illustrating an example of a circuit of a unit pixel of an image sensor.

A unit pixel 200 performs photoelectric conversion of incident light to output a pixel current. For this, the unit pixel 200 is constituted with PMOS 210, which performs photoelectric conversion of incident light, and NMOS 220, which is connected to PMOS 210 to function as a switch. Here, the PMOS 210 controls the amount of the pixel current flowing through a channel formed between a source and a drain by an electric field that is generated by a floating gate 211 that is controlled with voltage changes caused by the light incident to a floating light receiving part 240. The NMOS 220 functions as a select transistor to perform the functions of selecting the unit pixel 200 to output the pixel current and determining an exposure time.

The source of the PMOS 210 is coupled to source voltage VDD, and the drain thereof is coupled to a drain of NMOS 220. The body of the PMOS 210 has a contact for external connection and the body of the NMOS 220 is coupled to ground voltage GND 225. The source of the NMOS 220 outputs the pixel current, which is then inputted to an IVC (I-V converter). The PMOS 210 and the NMOS 220 may be each realized through a general MOSFET process.

Figure 4:
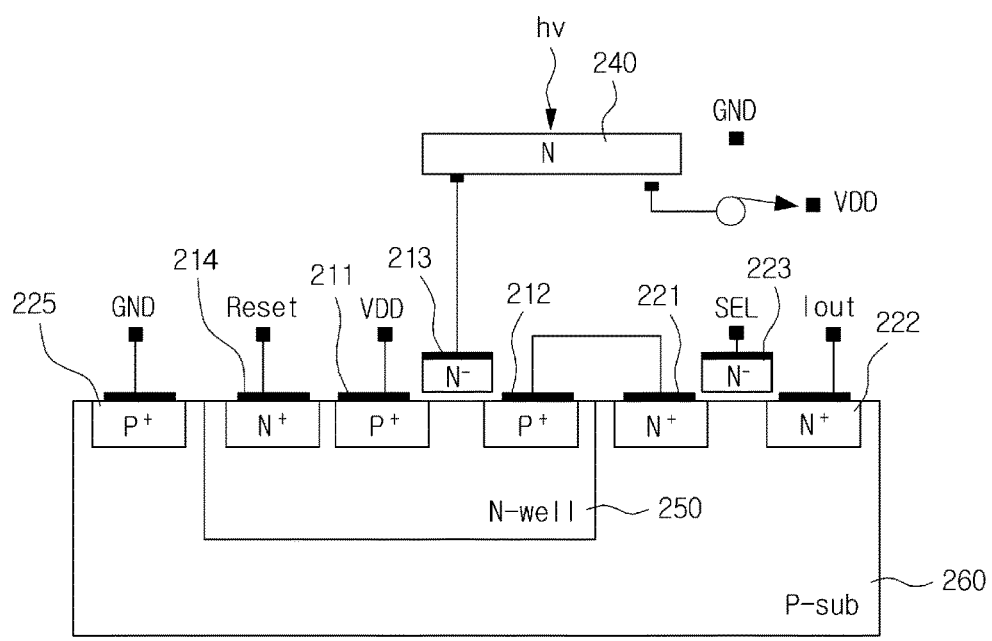
FIG. 4 is a diagram illustrating a cross section of a circuit of the unit pixel of the image sensor shown in FIG. 3.

FIG. 4 is a diagram illustrating a cross section of a circuit of the unit pixel of the image sensor shown in FIG. 3.

A floating gate 213 is formed above an insulating layer placed between a source 211 and a drain 212 of PMOS 210. The floating gate 213 is connected to a floating light receiving part 240 placed in a light receiving region of the surface of the image sensor. EHPs are generated by incident light at the floating light receiving part 240 and electrons are dragged to the floating gate 213 due to the electric field by the source 211 of the PMOS 210 to cause polarization of electric charges. The floating gate 213 controls the channel formed between the source 211 and the drain 212 based on the electric field of the channel changed by the polarization of electric charges generated at the floating light receiving part 240. The source 211, which is a first P+ region, and the drain 212, which is a second P+ region, are formed by injecting P+ impurities in a N-well 250. Silicide layers are formed above the source 211, the drain 212, and the floating gate 213 for metal contact.

The PMOS 210 includes a reset end 214 formed in a N-well 250. When the unit pixel 200 does not operate, voltage or current, which is provided to the N-well 250 through the reset end 214, may vary. The temperature of the substrate may vary with an outside temperature or an operation time. Since Vt of the N-well 250 is a function inversely proportional to temperature, it is possible to adjust Vt of the N-well 250 to be constant to the temperature by adjusting the voltage or current for resetting the N-well 250 outside the unit pixel 200 according to the temperature change. In other words, when the temperature increases, Vt becomes lower to allow more currents to flow, it is possible to reset with a higher voltage.

A control gate 223 is formed above an insulating layer placed between a drain 221 and a source 222 of the NMOS 220. The drain 221, which is a first N+ region, and the source 222, which is a second N+ region, are formed by injecting N+ impurities in a P-type substrate 250. The control gate 223 is formed by depositing polysilicon. Silicide layers are formed above the drain 221, the source 222, and the control gate 223 for metal contact. The drain 221 of the NMOS 220 is connected with the drain 212 of PMOS 210. The body 260 of NMOS 220 is coupled to ground voltage GND 225. Here, the ground voltage GND may be a reference voltage for having the NMOS 220 operate as a switch.

The unit pixel 200 operates as follows. Once the source voltage VDD is applied to the source 211 of the light receiving transistor 210 formed on a same substrate as the select transistor 220, a PN junction is formed in every area where N-well and p-type substrate 260 face each other, and a thick depletion region, which is electrically neutral, is formed due to reverse bias. Moreover, the source voltage VDD has a P channel induced due to an electric field between the source 211 and the drain 212 of the light receiving transistor 210. Afterwards, when light is incident to the floating light receiving part 240, an electron hole pair (EHP) is formed. The P channel is completed at the N-well located below the floating gate, that is, between the drain 211 and the source 212, due to the electric field change caused by change of the electric charges accumulated at the floating gate 213 by polarization of the floating light receiving part 240. By having a control signal SEL applied to the gate 223 of the select transistor 220 connected with the light receiving transistor 210 and having a channel formed between the drain 221 and the source 222 of the select transistor 220, the pixel current is outputted by receiving a signal electric charge formed at the light receiving transistor 210. While one photon generates one EHP in the conventional CMOS image sensor, the one photon induces an amplified channel current of PMOS in the light receiving transistor 210 of the unit pixel 200. Accordingly, current gain of photoelectric current reaches up to 100-1000, thereby allowing an image to be realized under a low illumination environment, in which a small amount of light is incident, and electric charges to be accumulated 100 to 1000 times faster than the conventional sensor. As a result, the time required for charge accumulation is sufficient with a delay of tens of clocks, rather than 1 frame or 1 line, thereby not requiring a long integration time and thus enabling a high-speed video to be realized.

Figure 5:
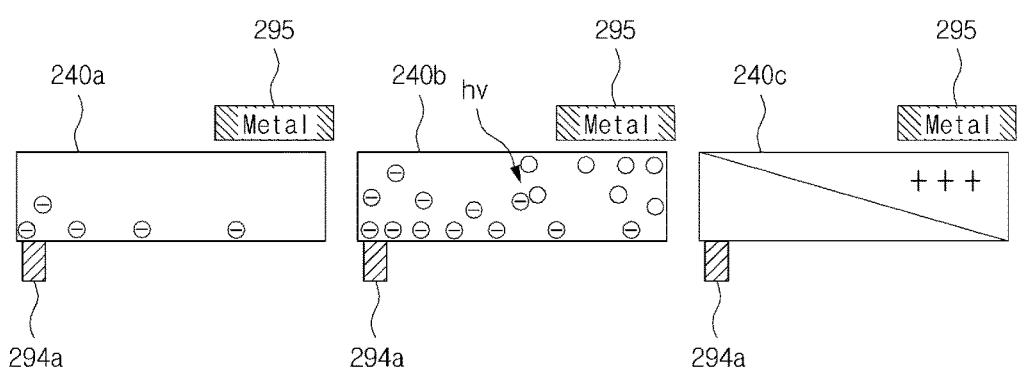
FIG. 5 is a diagram illustrating a principle of operation of the unit pixel of the image sensor shown in FIG. 3.

FIG. 5 is a diagram illustrating a principle of operation of the unit pixel of the image sensor shown in FIG. 3.

The floating light receiving part 240 may be formed with amorphous silicon or polysilicon, and may have the thickness of 100 nm to 6 um so as to widen an absorption wavelength range of light.

The floating light receiving part 240a shown on the left side shows how electrons are distributed while light is not irradiated. The lower left portion of the floating light receiving part 240a is electrically connected with the floating gate 213 of the light receiving transistor 210 through the via contact 241, a polarization inducing structure 295 is formed on the upper right portion of the floating light receiving part 240*a*. As described in FIG. 1, a polarization inducing structure may be also formed on the lower right portion of the floating light receiving part 240*a*.

The floating light receiving part 240*b* shown in the middle shows how an EHP is generated and how electrons and holes are polarized and distributed by an outside electric field when light is incident. In the floating light receiving part 240*b*, the electrons separated from the holes can freely move outside a grain boundary of amorphous silicon or polysilicon and are aggregated at the lower left side of the floating light receiving part 240*b* due to an electric field effect of the polarization inducing structure 295. Since the VDD connected to the source 211 of PMOS 210 attracts electrons due to the electric field, free electrons generated at the floating light receiving part 240*b*, which is connected to the adjacent floating gate 213, move to the floating gate 213 so that a polarization phenomenon is occurred in the floating light receiving part 240*b*.

The polarization inducing structure 295 is connected to the ground voltage GND when the unit pixel is operating. As the electrons are aggregated at the floating gate 213, density of the electrons becomes higher at the lower left portion of the floating light receiving part 240*b*, and the more the electrons are aggregated, the stronger the electric field for the channel of the floating gate 213 becomes. Meanwhile, as holes are pushed by the polarization inducing structure 295 and hole carriers move to the upper right side of the floating light receiving part 240*b*, a polarization phenomenon is occurred within the floating light receiving part 240*b*. When light is removed, the polarized electrons and holes are recoupled for a thermal equilibrium condition and become a state similar to the left side 240*b*.

The floating light receiving part 240*c* shown on the right side has the polarization phenomenon occurred by electrical property. The stronger the incident light is, the more the EHPs are generated and the stronger polarization phenomenon becomes. Thus, this change of the electric field of the floating light receiving part 240*c* by the polarization causes changes of the electric field of the floating gate 213 which is electrically connected thereto. Accordingly, the channel between the source 211 and the drain 212 of the light receiving transistor 210 is expanded, and the amount of current flowing through the channel is increased.

Figure 6:
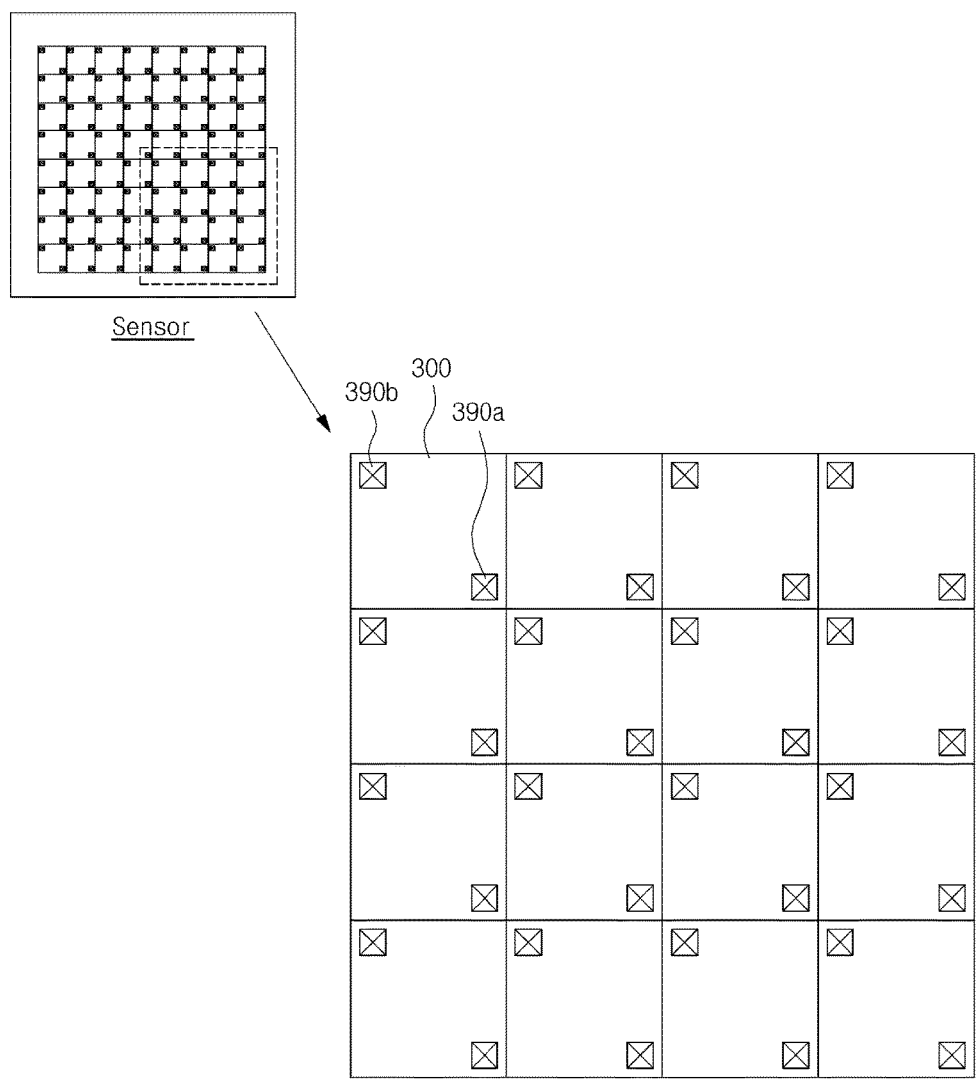
FIG. 6 is a diagram illustrating a g light receiving region of a surface of an image sensor constituted with the unit pixel shown in FIG. 1.
Figure 7:
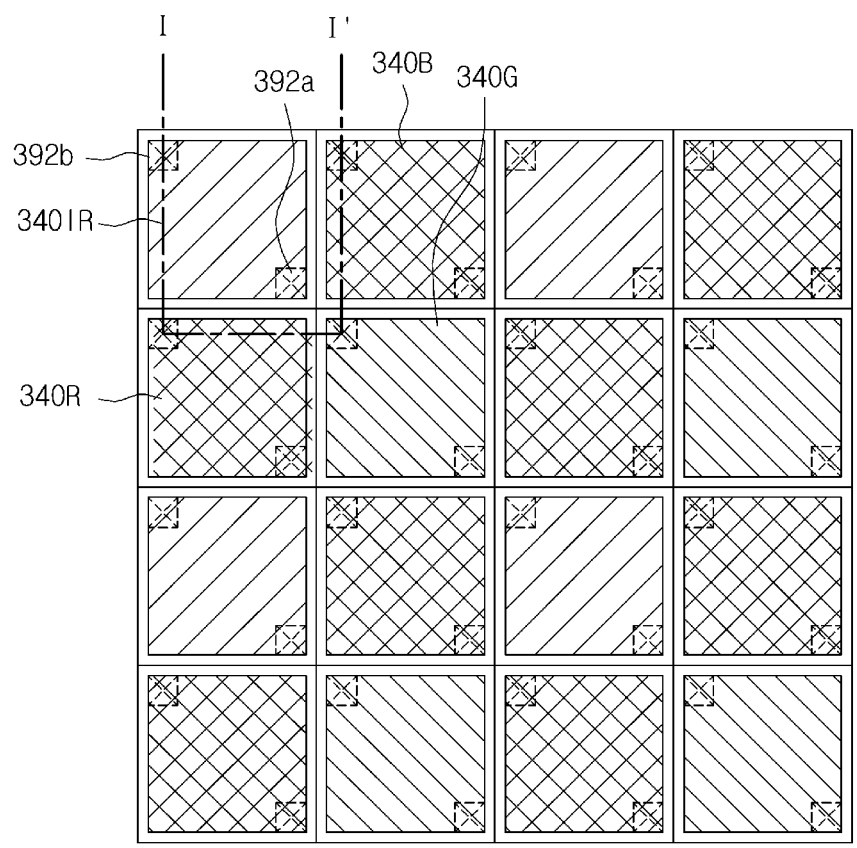
FIG. 7 is a diagram illustrating an example of a light receiving part connected to the light receiving region of the surface of the image sensor shown in FIG. 6.

FIG. 6 is a diagram illustrating a g light receiving region of a surface of an image sensor constituted with the unit pixel shown in FIG. 1, and FIG. 7 is a diagram illustrating an example of a light receiving part connected to the light receiving region of the surface of the image sensor shown in FIG. 6 Referring to FIGS. 6 and 7, an image sensor is constituted with a plurality of unit pixels 300. The plurality of unit pixels 300 may be arranged in various configurations. An example of the unit pixel 300 with square shapes arranged in a matrix form is illustrated in FIG. 6. A light receiving part is not arranged in a light receiving region of the surface of the image sensor shown in FIG. 6, and contact pads 392*a*, 392*b* for electrical connection with the light receiving part are exposed in the light receiving region of the surface of the image sensor. A pair of the contact pads 392*a*, 392*b* is arranged on the opposite edges in FIG. 6. However, this is for illustrative purposes and it shall be appreciated that the number and arrangement of contract pads may vary with a type of the light receiving part and/or a type of the light receiving transistor.

Referring to FIG. 7, light receiving parts 340IR, 340R, 340G, 340B are arranged in a Bayer pattern in a light receiving region of a surface of an image sensor. The light receiving part 3401R receives infrared, the light receiving part 340R receives red light, light receiving part 340G receives green light, and the light receiving part 340B receives blue light. Each of the light receiving parts 340IR, 340R, 340G, 340B may be electrically connected to a floating gate of a light receiving transistor through a contact pad 392*a* exposed in the light receiving region of the surface of the image sensor. Here, when the light receiving parts 340IR, 340R, 340G, 340B are floating light receiving parts formed by depositing amorphous silicon or polysilicon, a contact pad 392*b* may be connected to a polarization inducing structure or may function as a polarization inducing structure. On the other hand, when the light receiving parts 3401R, 340R, 340G, 340B are formed of a photovoltaic (PV) sensor of which voltage among electrical properties changes by light such as PN junction photo diode, thermopile and the like, a photoconductive (PC) sensor of which resistance and/or current among electrical properties changes by light, such as thermistor, bolometer and the like, or a pyroelectric of which capacity among electrical properties by light changes temporally, the contact pad 392*b* is used to provide reference voltage or current. Hereinafter, the PV sensor, the PC sensor, the pyroelectric sensor are called as heterogeneous sensor.

Figure 8:
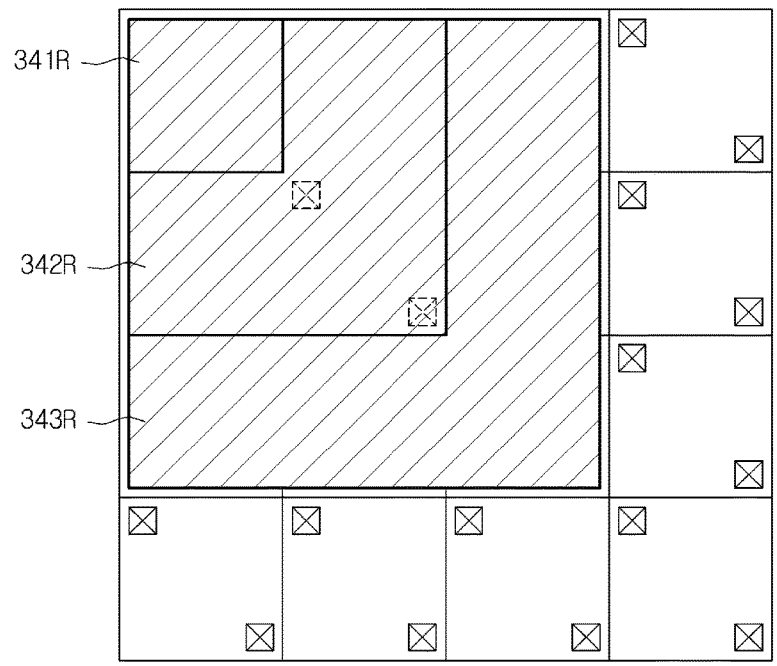
FIG. 8 is another diagram illustrating an example of a light receiving part connected to the light receiving region of the surface of the image sensor shown in FIG. 7.

FIG. 8 is another diagram illustrating an example of a light receiving part connected to the upper surface of the image sensor shown in FIG. 7.

An area of the light receiving part 341R, 342R, 343R may vary with a kind of incident light. In the case of a general image sensor, since the light receiving part which receives light is formed inside the substrate, it is difficult to extend the area of the light receiving part above a certain size or arrange freely by other components adjacent thereto and/or metal lines transferring control signals. However, when the light receiving part is formed independently from a light receiving transistor in the light receiving region of the surface of the image sensor, freedom for selecting area and/or position of the light receiving part significantly increases. Particularly, in the case of an image sensor requiring a large area of the light receiving part such as an image sensor with high sensitivity, the light receiving part may be formed in a region corresponding to a plurality of unit pixels. In this case, the light receiving part may be connected to a contact pad of one unit pixel of the unit pixels at the lower portion of the light receiving part.

For this, when an area of the light receiving part is greater than that of a unit pixel, light receiving parts 341R, 342R, 343R may be extended by an integral multiple of the area of the unit pixel. Here, the unit pixel only formed in the middle of the light receiving part 343R may be connected to the light receiving part. Thus, most of the area of the unit pixel may be used as the light receiving part so that properties such as sensitivity are improved. On the other hand, size of the unit pixel may be reduced since the unit pixel does not include the light receiving part. After forming the unit pixel to provide high resolution, the light receiving part with various areas may be realized according to fields where an image sensor is to be applied by simply modifying metal lines for connection.

Figure 9:
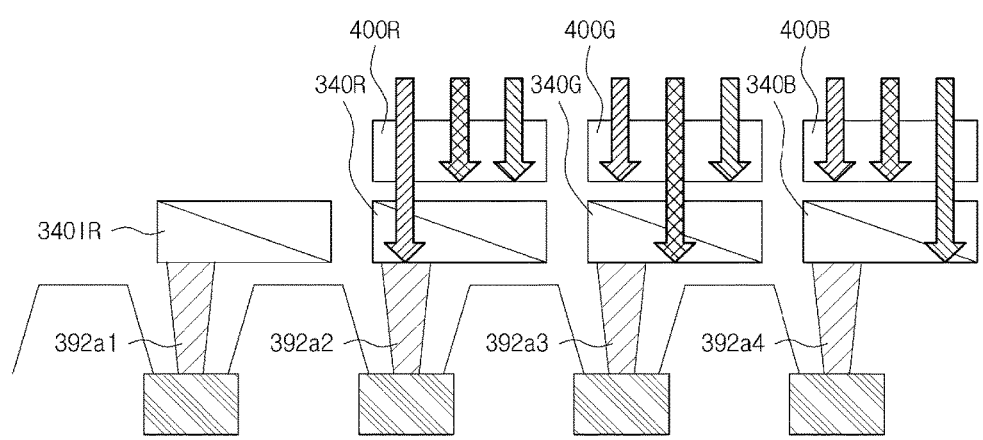
FIG. 9 is a diagram illustrating a cross section cut along an I-I' line of the light receiving part shown in FIG. 7.

FIG. 9 is a diagram illustrating a cross section cut along an I-I' line of the light receiving part shown in FIG. 7.

Referring to FIG. 9, cross sections of a light receiving part 3401R without using a color filter, and light receiving parts 340R, 340G, and 340B with using color filters 400R, 400G, and 400B are illustrated. The color filter 400R is formed above the light receiving part 340R to receive red light among incident lights. The color filter 400G is formed above the light receiving part 340G to receive green light. The color filter 400B is formed above the light receiving part 340B to receive blue light. The light receiving parts 340R, 340G, 340B formed below the color filters 400R, 400G, 400B, respectively, receive red light, green light, and blue light, respectively. The color filter may not be formed above the light receiving part 340IR which receives infrared. The image sensor with this structure may detect visible light and infrared at the same time so that it may be used for applications to realize colors at day and night.

Figure 10:
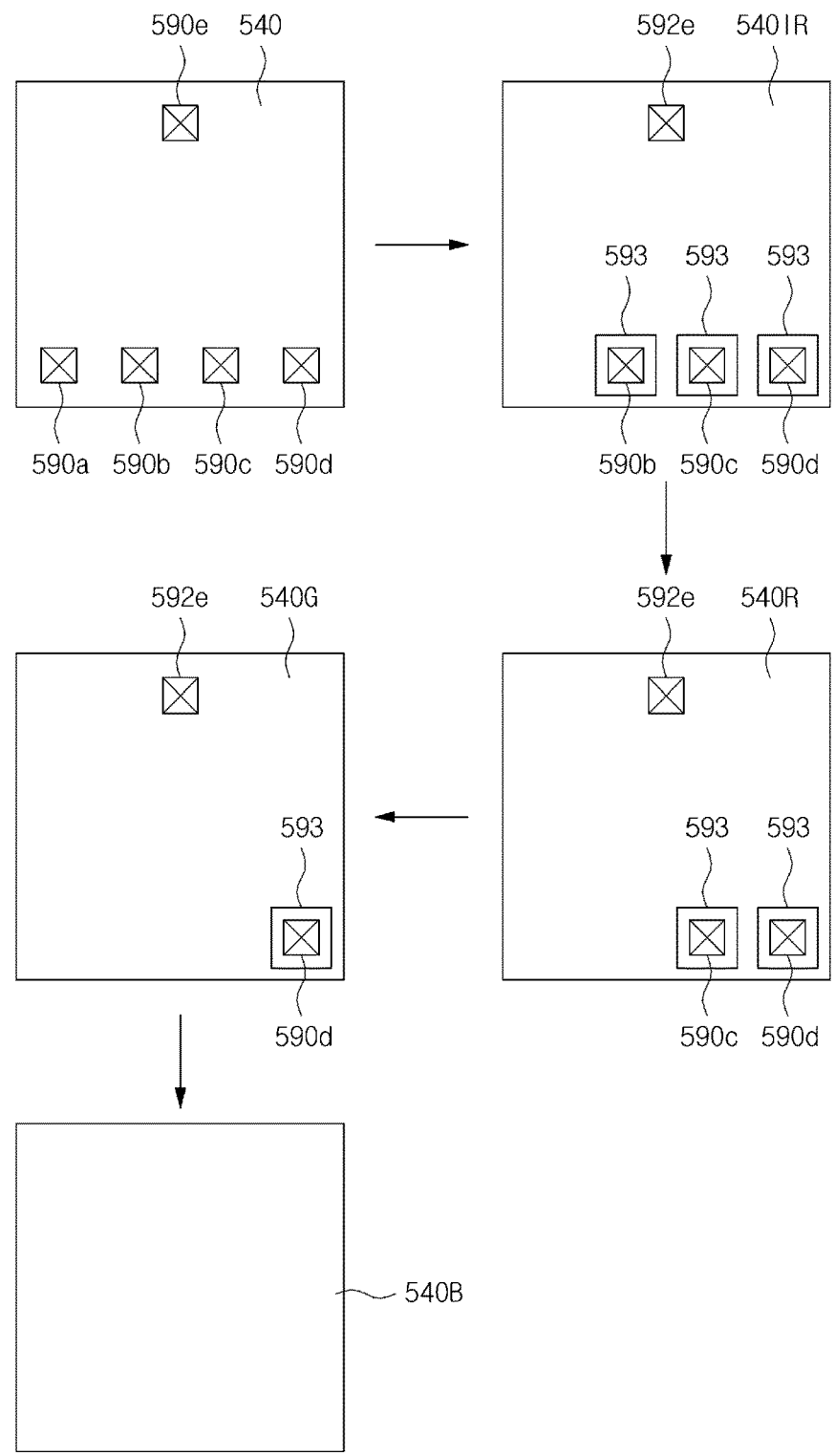
FIG. 10 is a diagram illustrating an example of a process for forming a plurality of light receiving layers.
Figure 11:
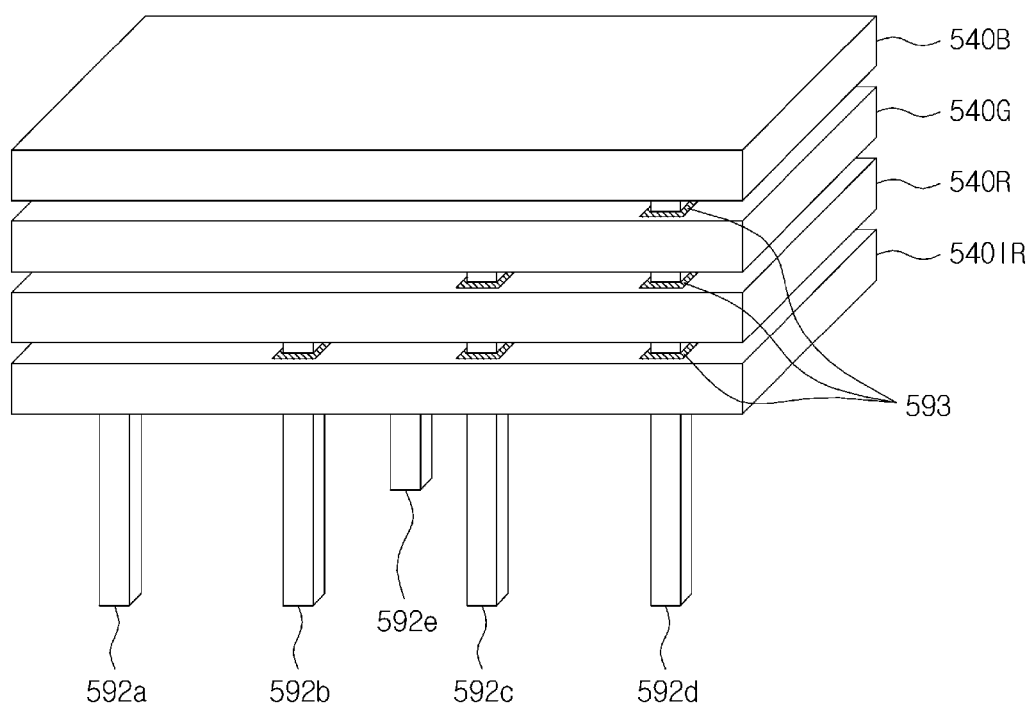
FIG. 11 is a diagram illustrating an example of a light receiving part including the light receiving layers formed according to the process shown in FIG. 10.

FIG. 10 is a diagram illustrating an example of a process for forming a plurality of light receiving layers, and FIG. 11 is a diagram illustrating an example of a light receiving part including the light receiving layers formed according to the process shown in FIG. 10.

A light receiving part may be formed by forming a plurality of light receiving layers. Incident light may be absorbed to different light receiving layers based on wavelength when it passes each light receiving layer. Blue light with the shortest wavelength is absorbed by the light receiving layer formed on the top among the plurality of light receiving layers, and then green light, red light, and near infrared light are absorbed by each light receiving layer according to the formed order of the light receiving layers.

Referring to FIG. 10 and FIG. 11, contact pads 590a, 590b, 590c, 590d to electrically connect the light receiving part with a floating gate of the unit pixel and polarization inducing structure or a contact pad 590e to apply reference voltage/current are formed in the light receiving region of the surface of the image sensor. Here, the number or position of the contact pads 590a, 590b, 590c, 590d, 590e may vary with the number of kinds of light receiving layers included in the light receiving part and/or position/kinds of light receiving transistors. An example including 4-layered light receiving parts is illustrated in FIG. 10 to receive blue light, green light, red light, and near infrared. Here, the light receiving layer may be also implemented with heterogeneous sensors in addition to the floating light receiving layers.

A light receiving layer 5401R is formed to receive near infrared in the light receiving region of the surface of the image sensor. The light receiving layer 5401R is electrically connected to the floating gate of the light receiving transistor, formed below the light receiving region of the surface of the image sensor, through the contact pad 590a. When the light receiving layer 5401R is formed with heterogeneous sensors, the light receiving layer 5401R is electrically connected to a metal line which transfers reference voltage/current through the contact pad 590e. On the other hand, when the light receiving layer 5401R is a floating light receiving layer formed of amorphous silicon or polysilicon, a polarization inducing structure (not shown) connected to the contact pad 590e is formed near the light receiving layer 540IR. The contact pads 590b, 590c, 590d, which are not connected with the light receiving layer 5401R, are extended toward the upper portion of the light receiving layer 5401R by using for example, via contacts 592b, 592c, 592d. An insulating layer 593 may surround the via contacts 592b, 592c, 592d to electrically insulate. The light receiving layer 540R to receive red light, the light receiving layer 540G to receive green light, and the light receiving layer 540B to receive blue light are sequentially formed by the same process. An inter-metal dielectric layer is formed between the light receiving layers. Meantime, the light receiving layer to receive green light may be divided into 9 pieces and each light receiving layer may detect green light to improve color resolution.

Thicknesses of the light receiving layers 5401R, 540R, 540G, 540B may be different among each other. When light is incident to the floating light receiving layer formed of amorphous silicon or polysilicon, blue light is absorbed in depth of 0-0.3 um, green light is in a depth of 0-1.0 um and green light is in a depth of 0-1.0 um. The light receiving layers 5401R, 540R, 540G, 540B may be formed with different thicknesses according to light wavelength to be received. Since the floating light receiving part is formed by depositing amorphous silicon or polysilicon in the light receiving region of the surface of the image sensor, it facilities controlling the thickness. This may be applied to examples forming the light receiving part in the process illustrated in FIG. 9.

The light receiving layers 5401R, 540R, 540G, 540B may be formed in a PN junction diode structure. The PN junction diode may be formed of polysilicon or amorphous silicon. When it is formed to detect UV, the PN junction diode may be formed using a semiconductor compound such as GaN, ZnO or the like having wide bandgaps. When it is formed to detect visible and infrared light, the PN junction diode may be formed in a solar cell structure. When it is formed to detect X-ray, the light receiving part may be formed by depositing a-Se. This may be applied to examples forming the light receiving part in the process illustrated in FIG. 9.

The pixel current generated by the light receiving layer 540B further includes pixel current components generated by green light, red light and infrared in addition to blue light. The pixel current generated by the light receiving layer 540G further includes pixel current components generated by red light and infrared in addition to green light. Thus, data detected by the light receiving layer is corrected by referring to data of the surrounding pixels.

When the light receiving part is formed by forming the light receiving layers, sensitivity is improved. The formed light receiving layers minimize light loss and there is no color loss since all wavelength ranges of visible and infrared light are absorbed. An area of the light receiving part is increased, resulting in improvement of sensitivity, compared the light receiving parts which are arranged at the same plane to receive light having different wavelengths.

Figure 12:
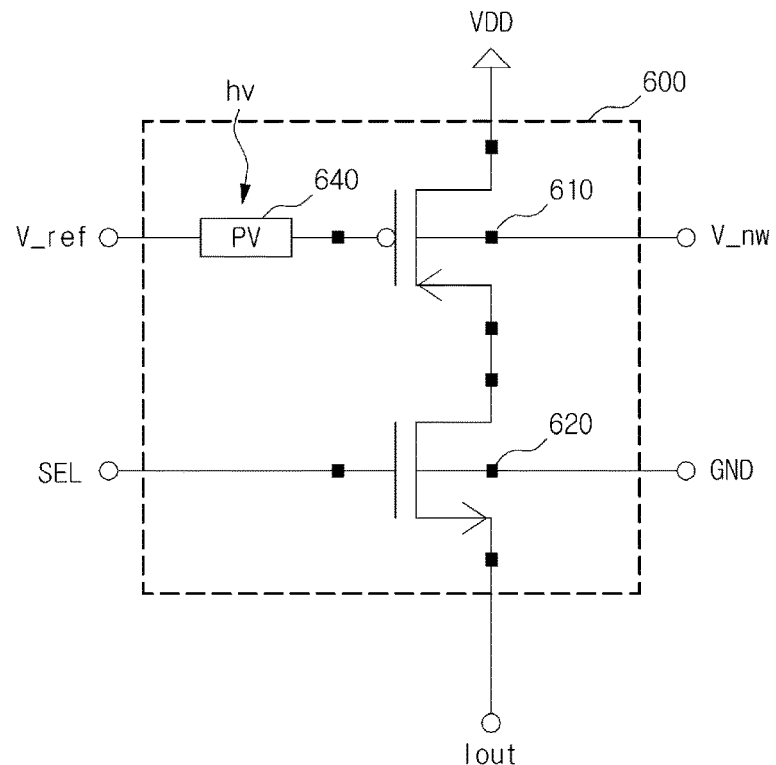
FIG. 12 is a diagram illustrating another example of a circuit of a unit pixel of an image sensor.

FIG. 12 is a diagram illustrating another example of a circuit of a unit pixel of an image sensor.

A unit pixel 600 performs photoelectric conversion of incident light to output a pixel current. For this, the unit pixel 600 is constituted with PMOS 610, which performs photoelectric conversion of incident light, and NMOS 620, which is connected to PMOS 610 to function as a switch. Here, the PMOS 610 functions as a light receiving transistor which controls the amount of the pixel current flowing through a channel formed between a source and a drain by an electric field that is generated by a floating gate 613 that is controlled with voltage changes caused by the light incident to a floating light receiving part 640, which is formed with a PV sensor generating photoelectro-motive force. The NMOS 620 functions as a select transistor to perform the functions of selecting the unit pixel 600 to output the pixel current and determining an exposure time.

The source of the PMOS 610 is coupled to source voltage VDD, and the drain thereof is coupled to a drain of the NMOS 620. The body of the PMOS 610 has a contact for external connection to be connected with N-well bias voltage V_nw, and the body of the NMOS 620 is coupled to ground voltage GND 625. The source of the NMOS 620 outputs the pixel current, which is then inputted to an IVC (I-V converter). The PMOS 610 and the NMOS 620 may be each realized through a general MOSFET process.

Figure 13:
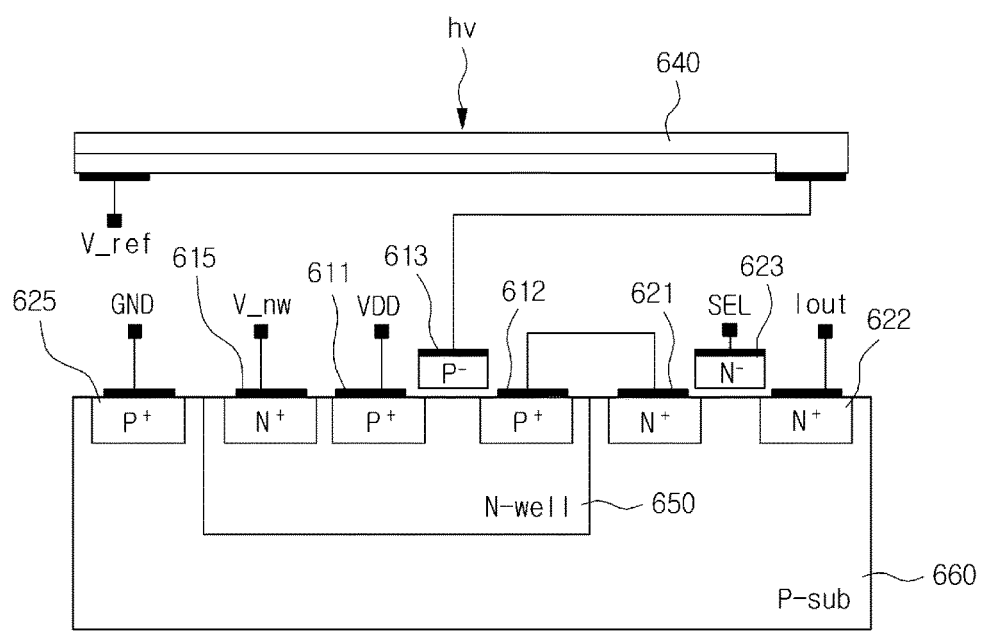
FIG. 13 is a diagram illustrating a cross section of the circuit of the unit pixel of the image sensor shown in FIG. 12.

FIG. 13 is a diagram illustrating a cross section of the circuit of the unit pixel of the image sensor shown in FIG. 12.

A floating gate 613 is formed above an insulating layer placed between a source 611 and a drain 612 of PMOS 610. The floating gate 613 is connected to a floating light receiving part 640 placed in a light receiving region of the surface of the image sensor. The light receiving part 640 may be formed of a photovoltaic sensor, for example, such as PN junction photo diode or thermopile. Here, the light receiving part 640 may be realized in a PC sensor in addition to a PV sensor. Here, the PN junction photo diode may be formed through PN junction with polysilicon or amorphous silicon. EHPs are generated by incident light at the floating light receiving part 640 and current flows by the generated EHPs. The floating gate 613 controls a channel formed between a source 611 and a drain 612 by changing the electric field of the channel according to voltage change of the light receiving part 640. The source 611, which is a first P+ region, and the drain 612, which is a second P+ region, may be formed by injecting P+ impurities in a N-well 650. The floating gate 613 is formed by depositing polysilicon. Silicide layers are formed above the source 611, the drain 612, and the floating gate 613 for metal contact.

One end of the light receiving part 640 is connected to a reference voltage V_ref, and the other end is connected to the floating gate 613. The light receiving part 640 is PN junction photo diode, P-type is connected to the reference voltage V_ref, and N-type is formed in the floating gate 613. P-type terminal is formed on a lower portion of the PN junction photo diode to increase light receiving efficiency by widening PN junction interface, and N-type terminal is formed on an upper portion of the PN junction photo diode. In addition, an area of the light receiving part 640 may be that of the unit pixel 600 or higher.

A thermopile, a thermistor, a bolometer, and a pyroelectric are non-cooling thermal sensors of which electrical properties are changed when light corresponding to the temperature of an object is received. For example, the thermopile outputs voltage according to temperature change, and the thermistor or the bolometer measures conductivity resistance change, and the pyroelectric measures capacitance change. The non-cooling thermal sensor which measures difference between a sensor itself temperature and an object temperature requires a structure for a heat sink. For this, the non-cooling thermal sensor is spaced apart from the light receiving region of the surface of the image sensor and a MEMS process is used not to be influenced by the temperature from the sensor. On the other hand, since temperature of the object can be known when temperature of the sensor is known, the unit pixel may include a circuit to measure temperature of the sensor. Here, since the light receiving part 640 is in a thermal equilibrium state by the heat transferred from the substrate in which the sensor is formed, temperature of the light receiving part 640 may be provided through the circuit which measures temperature of the sensor.

The PMOS 610 may include N-well bias voltage end V_nw formed in a N-well 650. The N-well bias voltage end V_nw provides N-well bias voltage V_nw, which is fitted for a PV sensor, according to driving voltage of the PV sensor or operation condition of the PV sensor detecting light. The N-well bias voltage V_nw may be set globally from an outside of the unit pixel. Furthermore, the N-well may be maintained as a floating body without the N-well bias voltage end V_nw.

A control gate 623 is formed above an insulating layer placed between a drain 621 and a source 622 of the NMOS 620. The drain 621, which is a first N+ region, and the source 622, which is a second N+ region, is formed by injecting N+ impurities in a P-type substrate 650, and the control gate 623 is formed by depositing polysilicon. Silicide layers are formed above the drain 621, the source 622, and the control gate 623 for metal contact. The drain 621 of the NMOS 620 is connected to a drain 612 of the PMOS 610. A body 660 of the NMOS 620 is coupled to a ground voltage GND 625. Here, the ground voltage GND 625 may be a reference voltage for having NMOS 620 operate as a switch.

In a single N-well, one unit pixel or a plurality of unit pixels belonging to a 2×2 array, a row or a column may be formed. In the case where one unit pixel is formed in a single N-well, P+ regions connected to ground voltage GND may be formed around (i.e., on 4 surfaces of) the N-well to electrically separate the N-well from the P-type substrate in order to eliminate an overflow or interference between adjacent pixels. Meanwhile, in the case where the N-well is shared in order to reduce the size of the unit pixel, like the case where a plurality of unit pixels are formed in a single N-well, a channel formed close to a surface of the substrate including a buried channel through an isolation method such as LOCOS or STI may have little or no effect to an adjacent unit pixel.

The unit pixel 600 operates as follows. Once the source voltage VDD is applied to the source 611 of PMOS 610 formed on a same substrate as NMOS 620, a PN junction is formed in every area where N-well 650 and p-type substrate 660 face each other, and a thick depletion region, which is electrically neutral, is formed due to reverse bias. Moreover, the source voltage VDD has a P channel induced due to an electric field between the source 611 and the drain 612 of the PMOS 610.

Here, the reference voltage V_ref and the N-well bias voltage V_nw are determined based on operation properties of the PN junction photo diode. When the light receiving part 640 is formed by depositing the PN junction diode with polysilicon or amorphous silicon, a P-type terminal is coupled to reference voltage V_ref and a N-type terminal is coupled to the floating gate 613. Since the voltage of PN junction interface without incident light is generally 0.7V, voltage V_FG which is applied to the floating gate 613 is V_ref−0.7V. Since no light is incident, current does not flow in a channel of the PMOS 610 or V_nw value is set to be positioned at a starting point of linear operation region. When light is incident, voltage applied to the light receiving part 640 increases, resulting in lowering V_FG since there is no current path from the PN junction diode to the floating gate 613. For example, when N-well bias voltage V_nw=VDD and reference voltage V_ref=VDD+0.7V, Ids=0 in a general PMOS operation. When diode voltage is increased by 0.1V, V_FG becomes VDD−0.1V and thus micro-current corresponding thereto flows. However, it is needed for the PMOS 610 to operate in a linear operation region for higher current change. V_FG and V_nw may be freely set to fit a high sensitivity region or WDR (wide range region) by experimentally setting V_FG and V_nw values for the region with high current change.

For example, in the case where the thermopile, which is a PV sensor, is used as the light receiving part 640, when a structure floated on the light receiving region of the surface of the image sensor is coupled to 2 nodes through a MEMS process, a thermal image sensor may be realized. When 7-15 um of infrared light, radiated from an object having a temperature which is different from that of a sensor, is received, the thermopile changes by several tens to hundreds mV due to seebeck effect. Accordingly, a thermal image sensor may be operated in a process which obtains image data for the current change corresponding to (+) or (−)voltage change by setting a V_FG value corresponding to the middle of a linear operation region of MOSFET.

Afterwards, when light is received to the light receiving part 640, P channel is completed at the N-well located below the floating gate 613, that is, between the drain 611 and the source 612, due to electric field change caused by photo-electro-motive force of the light receiving part 640. By having a control signal SEL applied to the gate 623 of the NMOS 620 connected with the PMOS 610 and having a channel formed between the drain 621 and the source 622 of the NMOS 620, the pixel current is outputted by receiving a signal electric charge formed at the PMOS 610.

While one photon generates one EHP in the conventional CMOS image sensor, the one photon induces an amplified channel current of PMOS 610 in the PMOS 610 of the unit pixel 600. Accordingly, current gain of photoelectric current reaches up to 100-1000, thereby allowing an image to be realized under a low illumination environment, in which a small amount of light is incident, and electric charges to be accumulated 100 to 1000 times faster than the conventional sensor. As a result, the time required for charge accumulation is sufficient with a delay of tens of clocks, rather than 1 frame or 1 line, thereby not requiring a long integration time and thus enabling a high-speed video to be realized.

Figure 14:
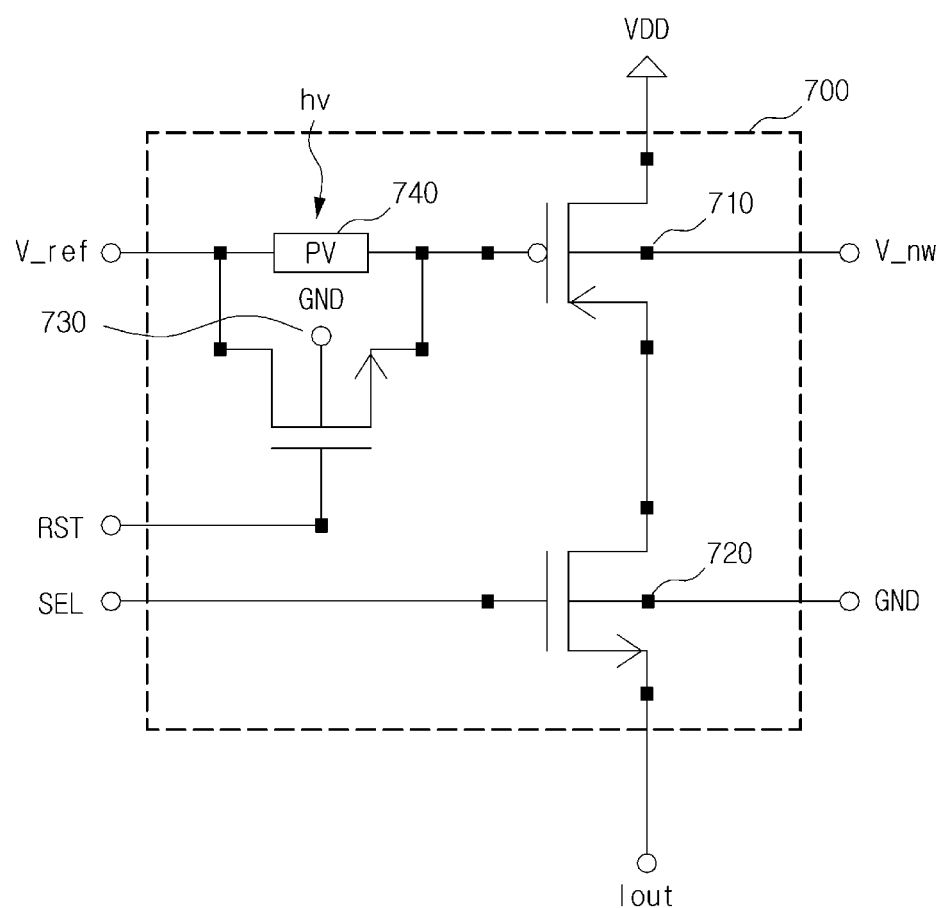
FIG. 14 is a diagram illustrating still another example of a circuit of a unit pixel of an image sensor.
Figure 15:
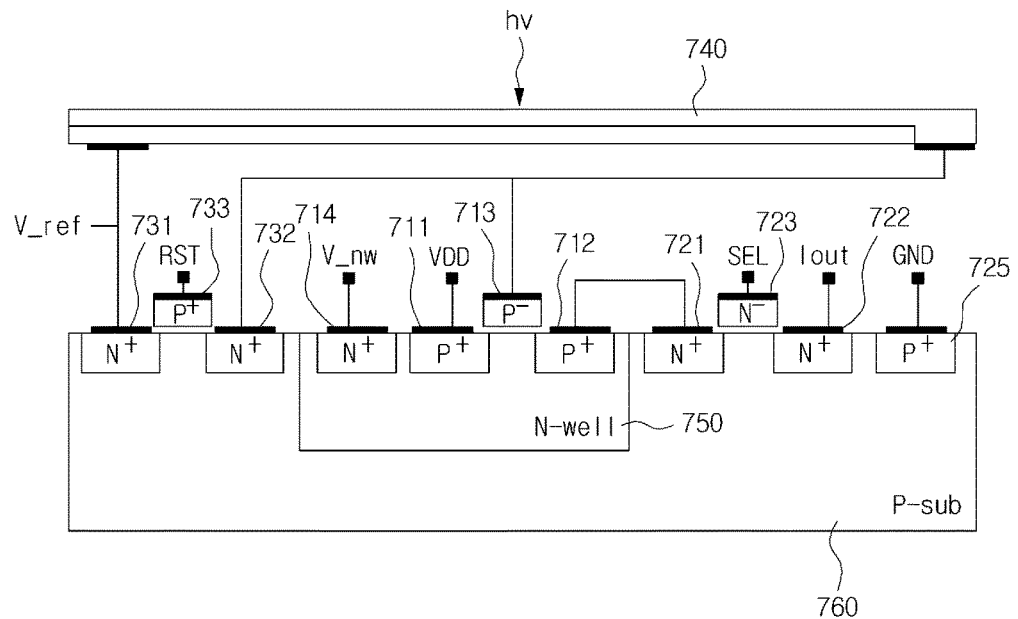
FIG. 15 is a diagram illustrating a cross section of the circuit of the unit pixel of the image sensor shown in FIG. 14.

FIG. 14 is a diagram illustrating still another example of a circuit of a unit pixel of an image sensor, and FIG. 15 is a diagram illustrating a cross section of the circuit of the unit pixel of the image sensor shown in FIG. 14. When the unit pixel of the image sensor in FIG. 14 is compared with that in FIG. 12, the unit pixel in FIG. 14 further includes a second NMOS 730 configured to reset a PV sensor 740. Any redundant description will be omitted and difference from that in FIG. 12 will be described.

Referring to FIGS. 14 and 15, the unit pixel 700 of the image sensor includes a PMOS 710 configured to function as a light receiving transistor, a first NMOS 720 configured to function as a select transistor, a second NMOS 730 configured to reset a light receiving part, and a light receiving part 740 configured to receive incident light.

The second NMOS 730 is formed in a P-type substrate 760. A drain 731 of the second NMOS 730 is connected to a P-type terminal of the light receiving part 740, and a source 732 is connected to a N-type terminal of the light receiving part 740 and a floating gate 713. A reference voltage V_ref is applied to the P-type terminal of the light receiving part 740. The reset gate 733 of the second NMOS 730 is formed above the insulating layer placed between the drain 731 and the source 732 and a reset signal RST is inputted thereto.

While the unit pixel 700 is operating when light is incident, the second NMOS 730 is OFF, the P-type terminal of the light receiving part 740 is coupled to the reference voltage V_ref, and the N-type terminal is coupled to the floating gate 713. After the first NMOS 720 selects a unit pixel to output a pixel current, when the reset signal RST is received, the P-type terminal and the N-type terminal of the light receiving part 740 are shorted by the second NMOS 730. Here, the remained electrons which are not recoupled may be eliminated from the light receiving part 740.

Meanwhile, when the light receiving part 740 is shorted by the second NMOS 730, the reference voltage V_ref is applied to the floating gate 713. Since the light receiving part 740 implemented with the PV sensor is formed after a CMOS process in which the PMOS 710, the first NMOS 720, and the second NMOS 730 are formed, there may be large variation between the sensors. Therefore, the reference voltage V_ref is applied to the floating gate 713 to be set as a reference value during resetting.

Figure 16:
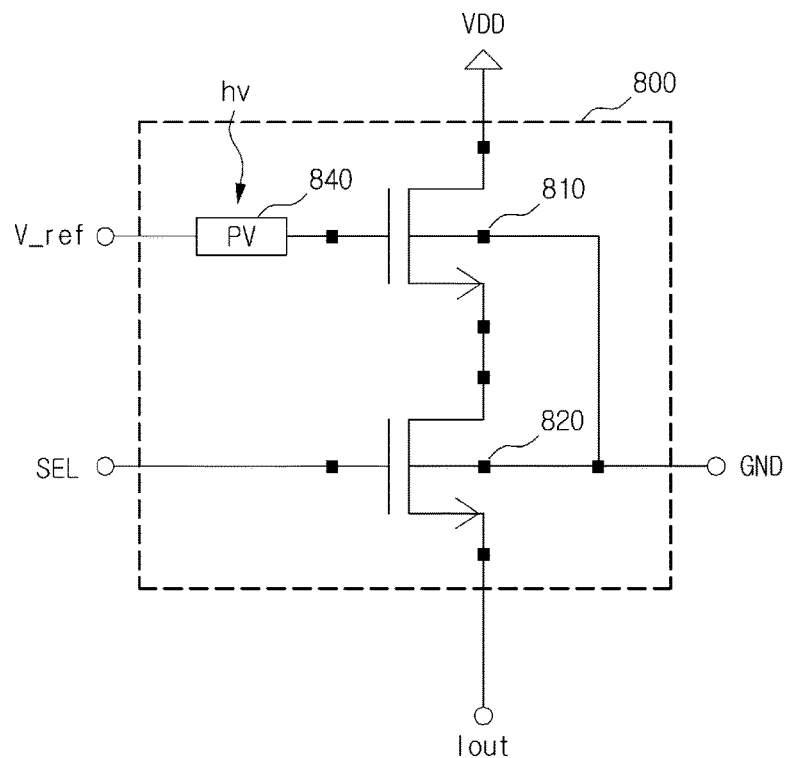
FIG. 16 is a diagram illustrating still another example of a circuit of a unit pixel of an image sensor.

FIG. 16 is a diagram illustrating still another example of a circuit of a unit pixel of an image sensor.

A unit pixel 800 performs photoelectric conversion of incident light to output a pixel current. For this, the unit pixel 800 is constituted with a first NMOS 810, which performs photoelectric conversion of incident light, and a second NMOS 820, which is connected to the first NMOS 810 to function as a switch. Here, the first NMOS 810 operates as a light receiving transistor to control the amount of the pixel current flowing through a channel formed between a source and a drain by an electric field that is generated by a floating gate 813 that is controlled with voltage changes caused by the light incident to a light receiving part 840 which is formed with a PV sensor generating photoelectro-motive force. The second NMOS 820 functions as a select transistor to perform the functions of selecting the unit pixel 800 to output the pixel current and determining an exposure time.

The drain of the first NMOS 810 is coupled to a source voltage VDD, and the source is coupled to a drain of the second NMOS 820. The first NMOS 810 and the second NMOS 820 share a body and are connected to a ground voltage GND 825. The source of the second NMOS 820 outputs a pixel current and the outputted pixel current is inputted to IVC. The first NMOS 810 and the second NMOS 820 may be each realized through a general MOSFET process.

Figure 17:
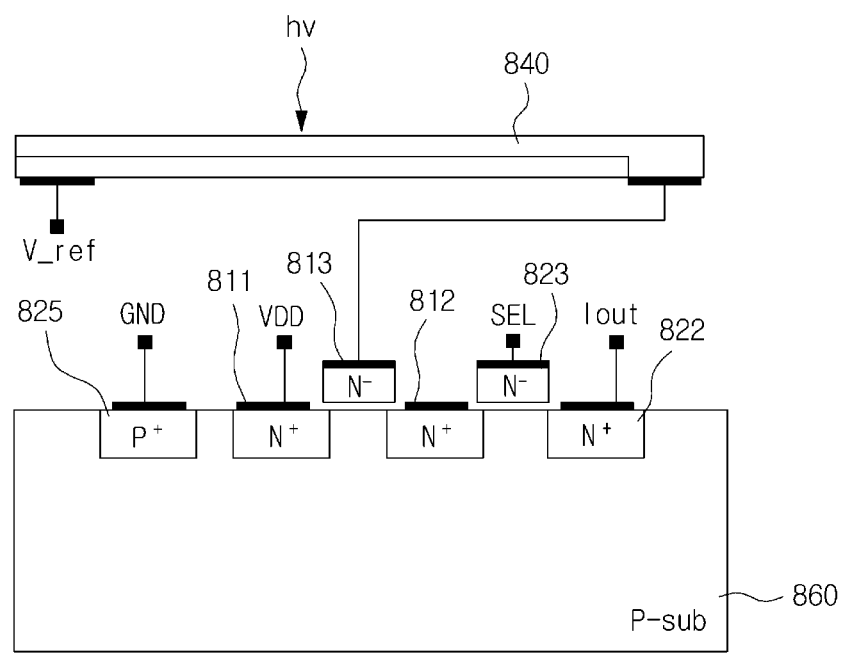
FIG. 17 is a diagram illustrating a cross section of the circuit of the unit pixel of the image sensor shown in FIG. 16.

FIG. 17 is a diagram illustrating a cross section of the circuit of the unit pixel of the image sensor shown in FIG. 16.

A floating gate 813 is formed above an insulating layer placed between a source 811 and a drain 812 of the first NMOS 810. The floating gate 813 is connected to a light receiving part 840 placed in a light receiving region of the surface of the image sensor. The light receiving part 840 may be formed of a photovoltaic sensor, for example, such as PN junction photo diode or thermopile. Here, the light receiving part 840 may be realized in a PC sensor in addition to a PV sensor. The PN junction photo diode may be formed with polysilicon or amorphous silicon (a-Si). EHPs are generated by incident light at the light receiving part 840 and current flows by the generated EHPs. The floating gate 813 controls a channel formed between a source 811 and a drain 812 by changing the electric field of the channel according to voltage change of the light receiving part 840. The drain 811, which is a first N+ region, and the source 812, which is a second N+ region, may be formed by injecting N+ impurities in the P-type substrate 860. The floating gate 813 is formed by depositing polysilicon. Silicide layers are formed above the drain 811, the source 812, and the floating gate 813 for metal contact. Meanwhile, the second N+ region, which is the source 812 of the first NMOS 810, operates as the drain of the second NMOS 820. Thus, when the second NMOS 820 is described, reference numeral of the drain of the second NMOS 820 may be assigned with 812. With this structure, it is possible to combine two N+ regions required for two NMOS to one N+ region when the NMOS is laid out, thereby reducing the size of the unit pixel.

One end of the light receiving part 840 is connected to a reference voltage V_ref, and the other end is connected to the floating gate 813. The light receiving part 840 is PN junction photo diode, P-type is connected to the reference voltage V_ref, and N-type is formed in the floating gate 813. P-type terminal is formed on a lower portion of the PN junction photo diode to increase light receiving efficiency by widening PN junction interface, and N-type terminal is formed on an upper portion of the PN junction photo diode. In addition, an area of the light receiving part 840 may be that of the unit pixel 800 or larger.

A control gate 823 is formed above an insulating layer placed between a drain 812 of the first NMOS 810 and a source 822 of the second NMOS 820. The drain 812, which is a drain 812, and the source 822, which is a third N+ region, are formed by injecting N+ impurities in a P-type substrate 850, and the control gate 823 is formed by depositing polysilicon. Silicide layers are formed above the drain 812, the source 822, and the control gate 823 for metal contact. A body 860 of the second NMOS 820 is coupled to a ground voltage GND 825. For this, a node to be connected to the ground voltage GND 825 is formed by injecting P+ impurities in a P-type substrate 850. Here, the ground voltage GND 825 may be a reference voltage for having the second NMOS 820 operate as a switch.

The unit pixel 800 operates as follows. Once the source voltage VDD is applied to the drain 811 of the first NMOS 810 formed on a same substrate as the second NMOS 820, a N-type channel below the insulating layer placed on the bottom portion of the floating gate 813 is induced between the drain 811 and the source 812 of the first NMOS 810.

Here, the reference voltage V_ref is determined based on operation properties of the light receiving part 840. When the light receiving part 840 is formed by depositing the PN junction diode with polysilicon or amorphous silicon, a P-type terminal is coupled to reference voltage V_ref and a N-type terminal is coupled to the floating gate 813. Since the body of the first NMOS 810 is connected to the ground voltage GND 825 in the structure shown in FIG. 17, the light receiving part 840 is controlled only by the reference voltage V_ref to operate the first NMOS 810 in a linear operation region. Since the voltage of PN junction interface without incident light is generally 0.7V, voltage V_FG which is applied to the floating gate 813 is V_ref−0.7V. Since no light is incident, current does not flow in a channel of the first NMOS 810 or reference voltage V_ref value is set to be positioned at a starting point of linear operation region. When light is incident, voltage applied to the light receiving part 840 increases, resulting in increasing V_FG since there is no current path from the PN junction diode to the floating gate 813. For example, when V_ref=GND+0.7V, since it is close to Vth of NMOS at a general NMOS operation, Ids of a linear region flows. When PN junction photo diode voltage is increased by 0.1V, V_FG becomes 0.8V and thus microcurrent corresponding thereto flows. However, since a body of the first NMOS 810 is connected to the ground voltage GND 825, the linear operation region becomes very steep. Accordingly, since WDR is very narrow, it is needed to design a length of the channel of the first NMOS 810 to be long and a voltage of the source 812 to be high to extend the linear operation region in order to provide very tiny current change with brightness of incident light. It is apparent that the first NMOS 810 operates in the linear operation region with this structure.

Afterwards, when light is received to the light receiving part 840, N channel is completed between the drain 811 and the source 812, due to electric field change by the floating gate 813 which is generated by photoelectro-motive force of the light receiving part 840. By having a control signal SEL applied to the control gate 823 of the NMOS 820 connected with the first NMOS 810 and having a channel formed between the drain 621 an 12*d* the source 822 of the second NMOS 820, the pixel current is outputted by receiving a signal electric charge formed at the first NMOS 810.

Figure 18:
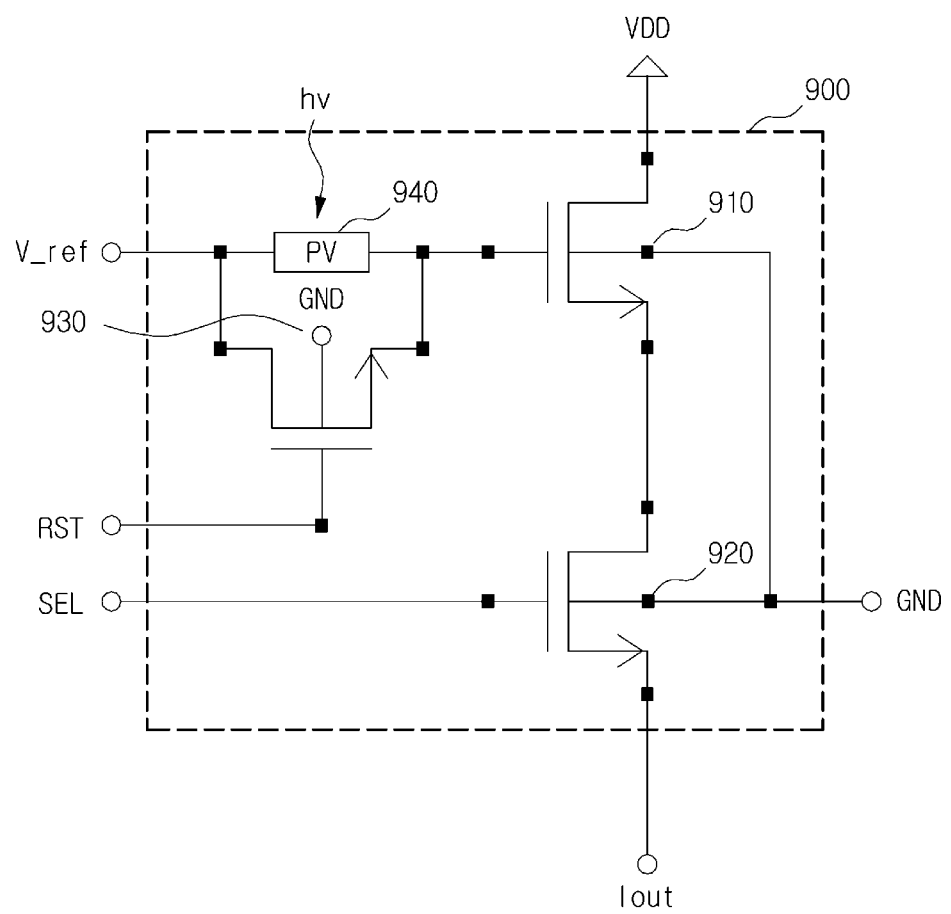
FIG. 18 is a diagram illustrating still another example of a circuit of a unit pixel of an image sensor.
Figure 19:
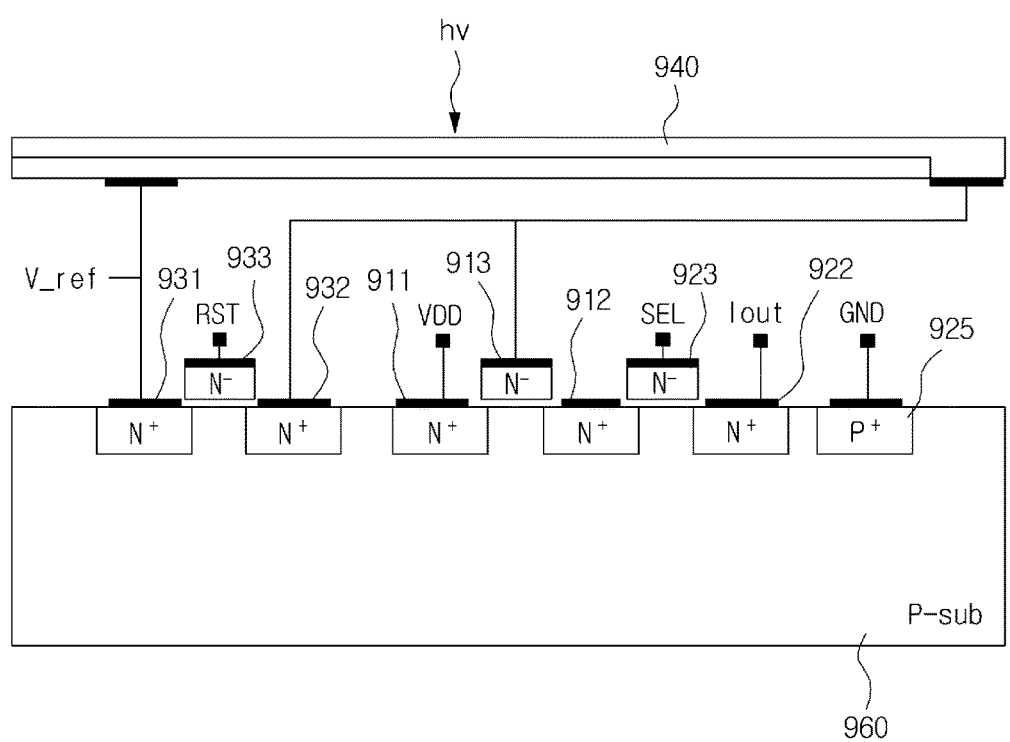
FIG. 19 is a diagram illustrating a cross section of the circuit of the unit pixel of the image sensor shown in FIG. 18.

FIG. 18 is a diagram illustrating still another example of a circuit of a unit pixel of an image sensor, and FIG. 19 is a diagram illustrating a cross section of the circuit of the unit pixel of the image sensor shown in FIG. 18.

A unit pixel of an image sensor in FIG. 18 further includes a third NMOS 930 configured to reset a PV sensor 940, compared to that in FIG. 16. Any redundant description will be omitted and difference from that in FIG. 12 will be described.

Referring to FIGS. 18 and 19, the unit pixel of the image sensor includes a first NMOS 910 configured to operate as a light receiving transistor, a second NMOS 920 configured to operate as a select transistor, a third NMOS 930 configured to reset a light receiving part, and a light receiving part 940 configured to receive incident light. The third NMOS 930 is formed on a P-type substrate 960. A drain 931 of the third NMOS 930 is connected to a P-type terminal of the light receiving part 940, and a source 932 is connected to a N-type terminal of the light receiving part 940 and a floating gate 913. A reference voltage V_ref is applied to the P-type terminal of the light receiving part 940. A reset gate 933 of the third NMOS 930 is formed above the insulating layer placed between the drain 931 and the source 932 and a reset signal RST is inputted thereto.

While the unit pixel 900 is operating when light is incident, the third NMOS 930 is OFF, the P-type terminal of the light receiving part 940 is coupled to the reference voltage V_ref, and the N-type terminal is coupled to the floating gate 913. After the second NMOS 920 selects a unit pixel to output a pixel current, when the reset signal RST is received, the P-type terminal and the N-type terminal of the light receiving part 940 are shorted by the third NMOS 930. Here, the remained electrons which are not recoupled may be eliminated from the light receiving part 940.

Meanwhile, when the light receiving part 940 is shorted by the third NMOS 930, the reference voltage V_ref is applied to the floating gate 913. Since the light receiving part 940 implemented with the PV sensor is formed after a CMOS process in which the first NMOS 910, second NMOS 920, and the third NMOS 930 are formed, there may be large variation between the sensors. Therefore, the reference voltage V_ref is applied to the floating gate 913 to be set as a reference value during resetting.

Figure 20:
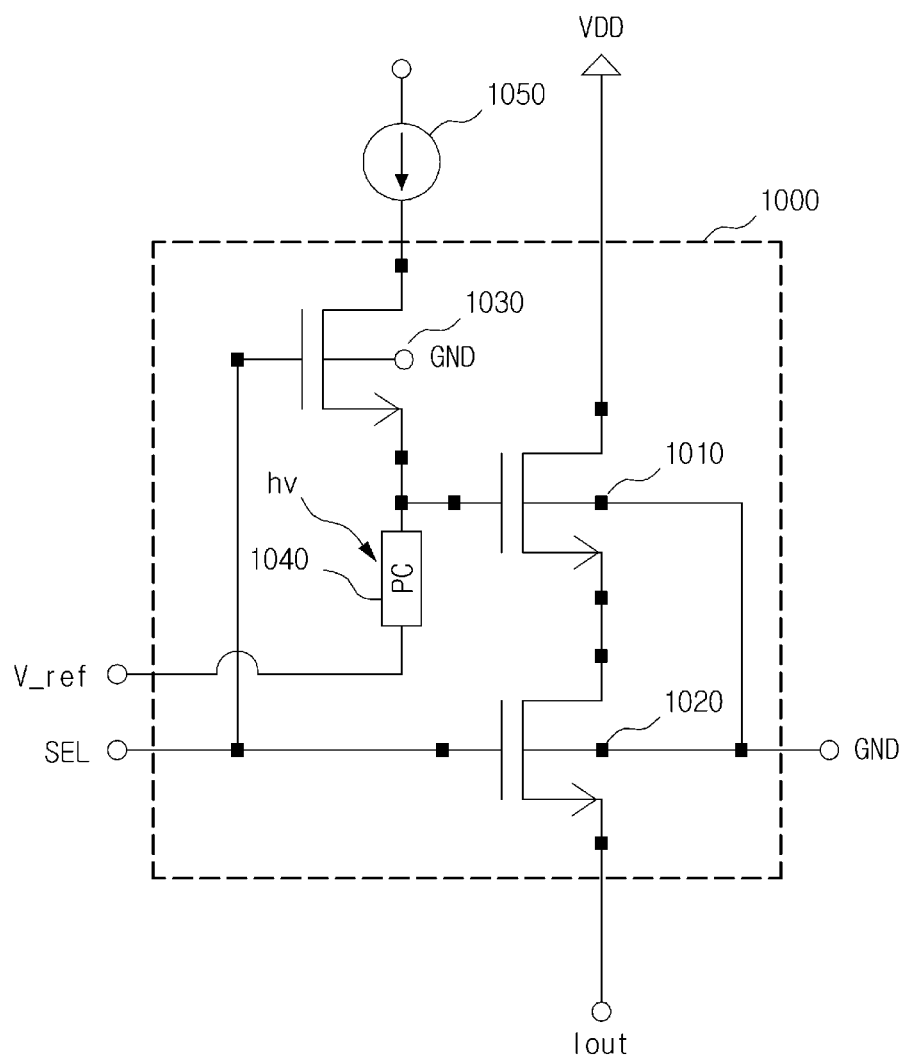
FIG. 20 is a diagram illustrating still another example of a circuit of a unit pixel of an image sensor.

FIG. 20 is a diagram illustrating still another example of a circuit of a unit pixel of an image sensor.

A unit pixel 1000 performs photoelectric conversion of incident light to output a pixel current. For this, the unit pixel 1000 is constituted with a first NMOS 1010, which performs photoelectric conversion of incident light, a second NMOS 1020, which is connected to the first NMOS 1010 to function as a switch, and a third NMOS 1030, which provides current to a light receiving part 1040. Here, the first NMOS 1010 operates as a light receiving transistor to control the amount of the pixel current flowing through a channel formed between a source and a drain by an electric field that is generated by a floating gate 1013 that is controlled with voltage changes caused by the light incident to a light receiving part 1040 which is a PV sensor of which resistance changes when light is incident. The second NMOS 1020 functions as a select transistor to perform the functions of selecting the unit pixel 1000 to output the pixel current and determining an exposure time. The third NMOS 1030 functions as a switch which provides current, provided from a constant current source, to the light receiving part 1040 for a short period of time. When it is designed for the PC sensor to accumulate electric charges using reverse bias PN junction photo diode followed by a capacitor, the constant current source may be replaced by a constant voltage source. Examples for implementing unit pixels using a capacitor will be explained with reference to FIGS. 22 and 23.

The drain of the first NMOS 1010 is coupled to a source voltage VDD, and the source is coupled to a drain of the second NMOS 1020. The first to the third NMOS 1010, 1020, 1030 share a body and are connected to a ground voltage GND 1025. The source of the second NMOS 1020 outputs a pixel current and the outputted pixel current is inputted to IVC. The drain of the third NMOS 1030 is connected to the constant current source, and the source is connected to one end of the light receiving part 1040 and the floating gate. A control signal SEL is applied to the gate of the second NMOS 1020 and the third NMOS 1030. The first to the third NMOS 1010, 1020, 1030 may be each realized through a general MOSFET process.

Figure 21:
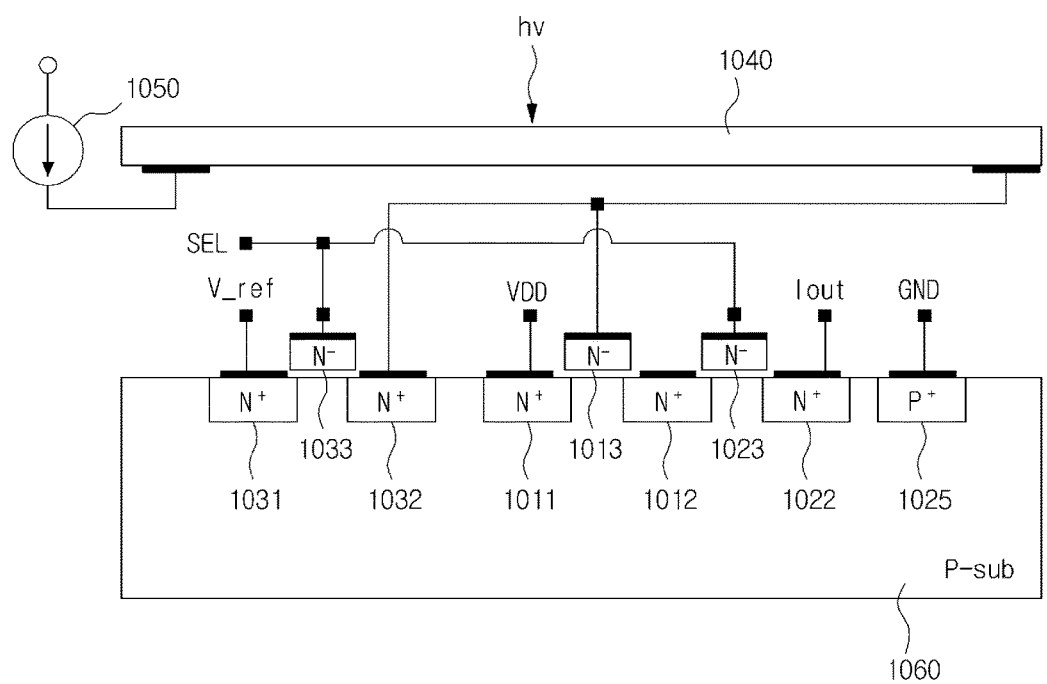
FIG. 21 is a diagram illustrating a cross section of the circuit of the unit pixel of the image sensor shown in FIG. 20.

FIG. 21 is a diagram illustrating a cross section of the circuit of the unit pixel of the image sensor shown in FIG. 20.

A floating gate 1013 is formed above an insulating layer placed between a source 1011 and a drain 1012 of the first NMOS 1010. The floating gate 1013 is connected to a light receiving part 1040 placed in a light receiving region of the surface of the image sensor. The light receiving part 1040 may be formed of a PC sensor, for example, such as thermistor, bolometer or the like. When light is incident to the light receiving part 1040, resistance of the light receiving part 1040 changes, resulting in voltage change. The floating gate 1013 changes electric field of a channel with the voltage change of the light receiving part 1040 to control the channel formed between the drain 1011 and the source 1012. The drain 1011, which is a first N+ region, and the source 1012, which is a second N+ region, are formed by injecting N+ impurities to a P-type substrate 1060. The floating gate 1013 is formed by depositing polysilicon. Silicide layers are formed above the drain 1011, the source 1012, and the floating gate 1013 for metal contact. The second N+ region, which is the source 1012 of the first NMOS 1010, operates as a drain of the second NMOS 1020. Thus, when the second NMOS 1020 is described, reference numeral of the drain of the second NMOS 1020 may be assigned with 1012.

One end of the light receiving part 1040 is connected to the constant current source 1050, and the other end is connected to the floating gate 1013 and a reference voltage V_ref. The light receiving part 1040 may be a thermistor or a bolometer. In addition, an area of the light receiving part 1040 may be that of the unit pixel 1000 or higher.

A control gate 1023 is formed above an insulating layer placed between a drain 1012 and a source 1022 of the second NMOS 1020. The drain 1012, which is a second N+ region, and the source 1022, which is a third N+ region, are formed by injecting N+ impurities in a P-type substrate 1060, and the control gate 1023 is formed by depositing polysilicon. Silicide layers are formed above the drain 1012, the source 1022, and the control gate 1023 for metal contact. A body 1060 of the second NMOS 1020 is coupled to a ground voltage GND 1025. For this, a node to be connected to the ground voltage GND 1025 is formed by injecting P+ impurities in the P-type substrate 1060. Here, the ground voltage GND 1025 may be a reference voltage for having the second NMOS 1020 operate as a switch.

A control gate 1033 is formed above an insulating layer placed between a drain 1031 and a source 1032 of the third NMOS 1030. The drain 1031, which is a fourth N+ region, and the source 1032, which is a fifth N+ region, are formed by injecting N+ impurities in the P-type substrate 1060, and the control gate 1033 is formed by depositing polysilicon.

Silicide layers are formed above the drain 1031, the source 1032, and the control gate 1033 for metal contact. The drain 1031 of the third NMOS 1030 is connected to the reference voltage V_ref, and the source 1032 is connected to the floating gate 1013 and the other end of the light receiving part 1040. A control signal SEL is applied to the gate 1033 of the third NMOS 1030.

The unit pixel 1000 operates as follows. Once the source voltage VDD is applied to the drain 1011 of the first NMOS 1010 formed on a same substrate as the second NMOS 1020, a N-type channel below the insulating layer placed on the bottom portion of the floating gate 1013 is induced between the drain 1011 and the source 1012 of the first NMOS 1010.

Here, the reference voltage V_ref is determined based on operation properties of the light receiving part 1040. Since the body of the first NMOS 1010 is connected to the ground voltage GND 1025 in the structure shown in FIG. 21, the light receiving part 1040 is only controlled by the reference voltage V_ref to operate the first NMOS 1010 in a linear operation region.

When the control signal SEL is inputted for a short period of time, the third NMOS 1030 is turned on to provide constant current through one end of the light receiving part 1040 and to connect the other end of the light receiving part 1040 to the reference voltage V_ref at the same time. Here, resistance of the light receiving part 1040 is changed by incident light which further changes voltage. N channel is completed controlled between the drain 1011 and the source 1012, due to electric field change by the floating gate 1013 which is generated by the voltage change of the light receiving part 1040. By having a control signal SEL applied to the control gate 1023 of the second NMOS 1020 connected with the first NMOS 1010 and having a channel formed between the drain 1012 an 12d the source 1022 of the second NMOS 1020, the pixel current is outputted by receiving a signal electric charge formed at the first NMOS 1010.

Figure 22:
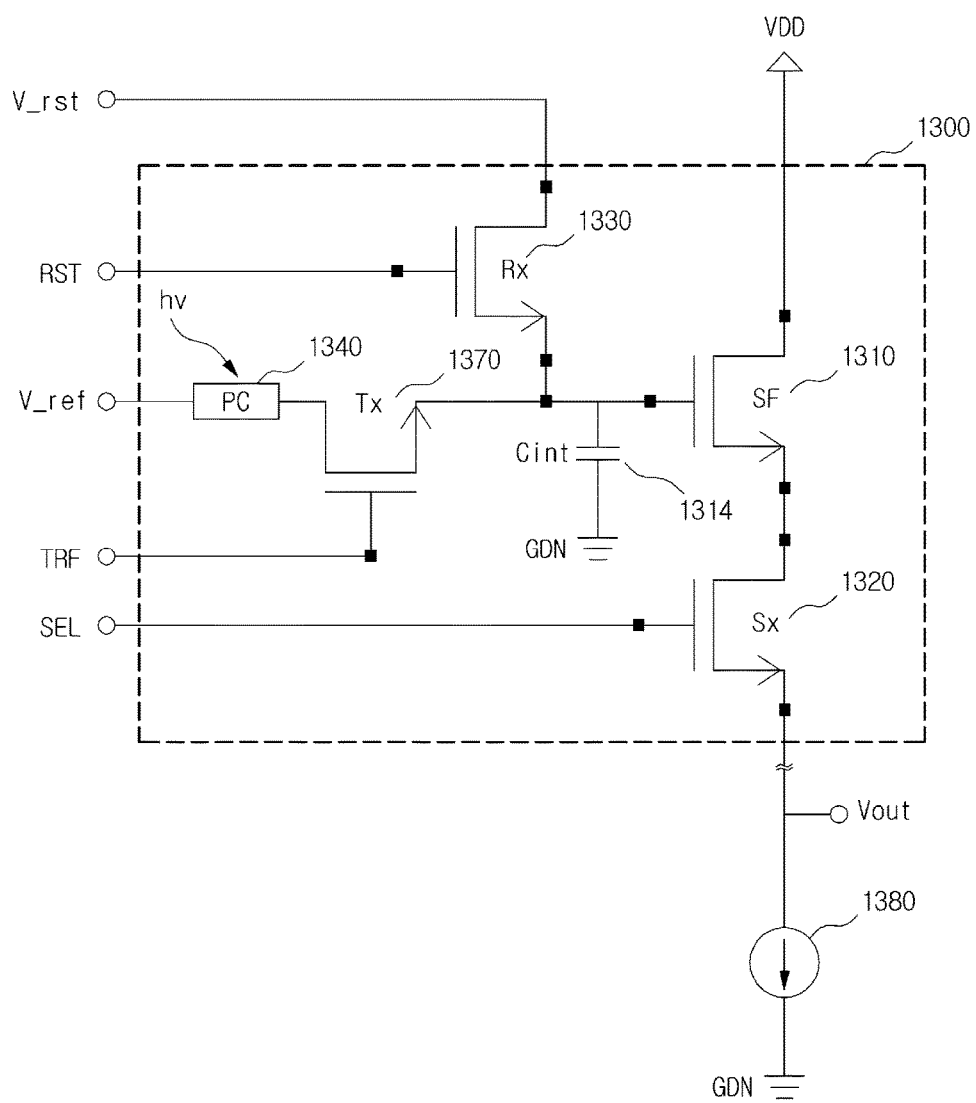
FIG. 22 is a diagram illustrating still another example of a circuit of a unit pixel of an image sensor.

FIG. 22 is a diagram illustrating still another example of a circuit of a unit pixel of an image sensor.

A unit pixel 1300 operates in an APS (Active Pixel sensor) to perform photoelectric conversion of incident light to output a pixel current. For this, the unit pixel 1300 is constituted with a light receiving part 1340 configured to perform photoelectric conversion of incident light, a capacitor $C_{int}$ 1314 configured to convert photoelectric current of the light receiving part 1340 to voltage, a first NMOS 1310 configured to output input voltage of the gate, a second NMOS 1320 configured to be connected to the first NMOS 1310 to function as a switch, a third NMOS 1330 configured to reset capacitor $C_{int}$ which accumulates electric charges according to current change of the light receiving part, and a fourth NMOS 1370 configured to control current supply from the light receiving part to the capacitor $C_{int}$ to function as a transfer transistor. Here, the first NMOS 1310 functions as a source follower amplifier and the gate of the first NMOS 1310 changes according to an amount of electric charges accumulated at the $C_{int}$ 1314. In other words, the first NMOS 1310 operates with voltage corresponding to the electric charge amount accumulated at the $C_{int}$ 1314 by the photoelectric current change generated by the light receiving part 1340, which is a PC sensor of which current changes when light is incident, and the second NMOS 1320 functions as a select transistor to perform the functions of selecting the unit pixel 1300 to output the pixel current and determining an exposure time.

The drain of the first NMOS 1310 is coupled to source voltage VDD, and the source is coupled to a drain of the second NMOS 1320. The source of the second NMOS 1320 outputs a pixel voltage and the pixel voltage is outputted by a common constant current source 1380 which is connected to an external color terminal of the unit pixel. A control signal SEL is applied to the gate of the second NMOS 1320. The drain of the third NMOS 1330 is connected to a reset voltage V_rst and source is connected to the gate of the first NMOS 1310. The drain of the fourth NMOS 1370 is connected to one end of the light receiving part and the source is connected to the gate of the first NMOS 1310. A control signal TRF is applied to the gate of the fourth NMOS 1370. The firsts to the fourth NMOS 1310, 1320, 1330, 1370 share a body and are connected to a ground voltage GND 1325. The firsts to the fourth NMOS 1310, 1320, 1330, 1370 may be each realized through a general MOSFET process.

Figure 23:
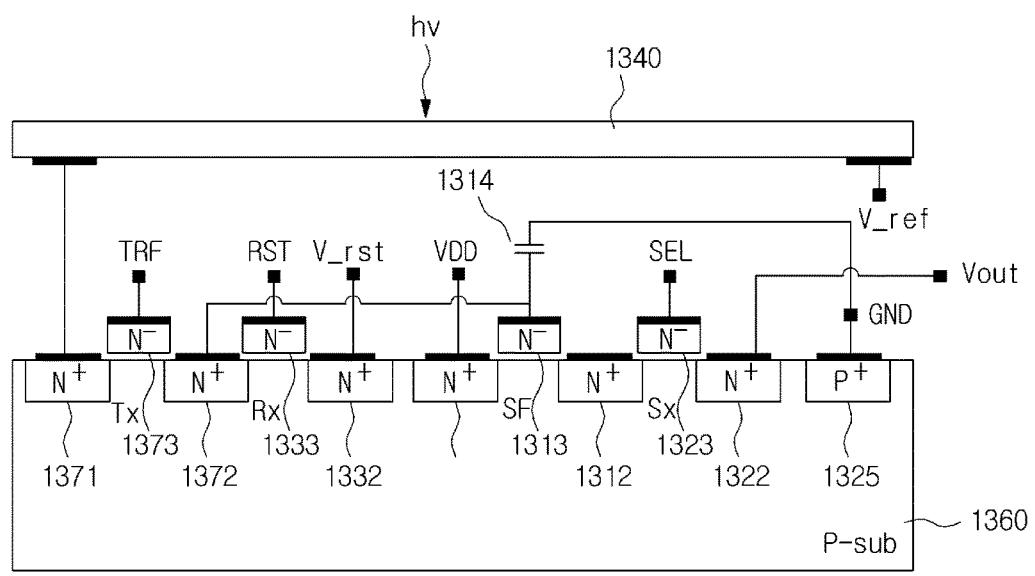
FIG. 23 is a diagram illustrating a cross section of the circuit of the unit pixel of the image sensor shown in FIG. 22.

FIG. 23 is a diagram illustrating a cross section of the circuit of the unit pixel of the image sensor shown in FIG. 22.

A first gate 1313 is formed above an insulating layer placed between a source 1311 and a drain 1312 of the first NMOS 1310. The first gate 1313 is connected to a light receiving part 1340 placed in a light receiving region of the surface of the image sensor. When light is incident to the light receiving part 1340, current outputted from the light receiving part 1340 changes. Electric charge amount accumulated at the capacitor $C_{int}$ is further changed by the outputted current change so that the first gate 1313 is able to control a channel formed between the drain 1311 and the source 1312 by changing the electric field of the channel. The drain 1311, which is a first N+ region, and the source 1312, which is a second N+ region, are formed by injecting N+ impurities in the P-type substrate 1360, and the first gate 1313 is formed by depositing polysilicon. Silicide layers are formed above the drain 1311, the source 1312, and the first gate 1313 for metal contact. The second N+ region, which is the source of the first NMOS 1310, operates as a drain of the second NMOS 1320. Thus, when the second NMOS 1320 is described, reference numeral of the drain of the second NMOS 1320 may be assigned with 1312.

One end of the light receiving part 1340 is connected to the reference voltage V_ref, and the other end is connected to a drain 1371 of the fourth NMOS 1370. The light receiving part 1340 may be a PC sensor of which photoelectric current outputted according to light changes. In addition, an area of the light receiving part 1340 may be that of the unit pixel 1300 or higher.

A second gate 1323 is formed above an insulating layer placed between a drain 1312 and a source 1322 of the second NMOS 1320. The drain 1312, which is a second N+ region, and the source 1322, which is a third N+ region, are formed by injecting N+ impurities in a P P-type substrate 1350, and the second gate 1323 is formed by depositing polysilicon. Silicide layers are formed above the drain 1312, the source 1322, and the second gate 1323 for metal contact. The drain 1312 of the second NMOS 1320 is connected to the source 1312 of the first NMOS 1310. A body 1360 of the second NMOS 1320 is coupled to a ground voltage GND 1325. For this, a node to be connected to the ground voltage GND 1325 is formed by injecting P+ impurities in the P-type substrate 1350. Here, the ground voltage GND 1325 may be a reference voltage for having the second NMOS 1320 operate as a switch.

A third gate 1333 is formed above an insulating layer placed between a drain 1332 and a source 1372 of the third NMOS 1330. The drain 1332, which is a fourth N+ region, and the source 1372, which is a fifth N+ region, are formed by injecting N+ impurities in the P P-type substrate 1350, and the third gate 1333 is formed by depositing polysilicon. Silicide layers are formed above the drain 1332, the source 1372, and the third gate 1333 for metal contact. The drain 1332 of the third NMOS 1330 is connected to a reset voltage V_rst and the source 1372 is connected to the first gate 1313. A reset signal RST is applied to the third gate 1333. Here, the reset voltage V_rst may be controlled based on properties of the light receiving part 1340. In other words, the reset voltage V_rst may be controlled according to properties of the light receiving part 1340 during the process for storing electric charge amount generated by photoelectric current change of the light receiving part 1340 with the reference voltage V_ref in the capacitor $C_{int}$ and converting it to voltage. Through this, various PC sensors in addition to the reverse bias PN junction photo diode may be used as the light receiving part. The fifth N+ region, which is the source 1372 of the third NMOS 1330, operates as a drain of the fourth NMOS 1370. Thus, when the fourth NMOS 1370 is described, reference numeral of the drain of the fourth NMOS 1370 may be assigned with 1372.

A fourth gate 1373 is formed above an insulating layer placed between a drain 1371 and a source 1372 of the fourth NMOS 1370. The source 1372, which is a fifth N+ region, and the drain 1371, which is a sixth N+ region, are formed by injecting N+ impurities in the P-type substrate 1360, and the fourth gate 1373 is formed by depositing polysilicon. Silicide layers are formed above the drain 1371, the source 1372, and the fourth gate 1373 for metal contact. The drain 1371 of the fourth NMOS 1370 is connected to one end of the light receiving part 1340 and the source 1372 is connected to the first gate 1313. A control signal TRF is applied to the fourth gate 1373. On the other hand, the fourth NMOS 1370 may be omitted.

The unit pixel 1300 operates as follows. Once the source voltage VDD is applied to the drain 1311 of the first NMOS 1310 formed on a same substrate as the second NMOS 1320, a N-type channel below the insulating layer placed on the bottom portion of the first gate 1313 is induced between the drain 1311 and the source 1312 of the first NMOS 1310.

Here, the reference voltage V_ref may be controlled based on properties of the light receiving part 1340. Since a body of the first NMOS 1310 is connected to the ground voltage GND 1325 in the structure shown in FIG. 23, the light receiving part 1340 is only controlled by the reference voltage V_ref to operate the first NMOS 1310 in a linear operation region. When the control signal TRF which controls integration time is inputted, an amount of current flowing, which is outputted from the light receiving part 1340 to which the reference voltage V_ref is applied by incident light, changes. The current outputted for the integration time is stored in the capacitor $C_{int}$. When the integration time is complete and the control signal TRF is turned off, a first sampling process is performed. During the first sampling process, the voltage applied to both ends of the capacitor $C_{int}$ is provided to the first gate 1313 of the first NMOS 1310 to output a first pixel voltage. After the first sampling process, a second sampling process is performed. During the second sampling process, a control signal RST is inputted to the third gate 1333 to reset the capacitor $C_{int}$. After the capacitor $C_{int}$ is reset, a second pixel voltage is outputted. An image is generated by using difference between the first pixel voltage and the second pixel voltage.

The above description is provided for illustrative purposes, and it shall be appreciated by anyone having ordinary skill in the art to which the following description pertains that permutations to other specific forms are possible without modifying the technical ideas or essential features.

Therefore, the embodiments described above shall be understood to be illustrative, not restrictive, in every aspect.

The scope of the description shall be apparent through the claims appended below, rather than through the above description, and it shall be interpreted that every permutation or modified form contrived from the meaning and scope, and their equivalents, of the claims is included in the claims of the following description.

What is claimed is:

1. A unit pixel formed on a substrate and configured to convert incident light to an electrical signal to constitute an image sensor, comprising:
 a source having a source voltage supplied thereto and having a silicide layer for metal contact formed thereabove;
 a drain spaced apart from the source and having a silicide layer for metal contact formed thereabove;
 a channel formed between the source and the drain and having a current flowed therethrough;
 an insulating layer formed above the channel;
 a light receiving part placed in a light receiving region of the surface of the image sensor and having changes in electrical properties caused by incident light therein; and
 a floating gate formed above the insulating layer so as to be placed between the source and the drain, configured to be electrically connected with the light receiving part, and configured to control an amount of current flowing through the channel by an electric field generated by the changes in electrical properties,
 wherein the light receiving part and the floating gate are electrically connected through at least one via contact which electrically connects a plurality of metals between the light receiving part and the floating gate.

2. The unit pixel of claim 1, further comprising at least one contact pad formed in the light receiving region of the surface of the image sensor,
 wherein the light receiving part is electrically connected with the floating gate through the contact pad.

3. The unit pixel of claim 1, wherein a silicide layer is formed above the floating gate, and at least one metal among the plurality of metals is arranged to shield the light incident to the floating gate.

4. The unit pixel of claim 1, further comprising a wavelength band selecting filter formed above the light receiving part.

5. The unit pixel of claim 1, wherein the light receiving part is formed by forming a plurality of light receiving layers of which light wavelengths to detect are different.

6. The unit pixel of claim 5, wherein the plurality of light receiving layers comprise:
 a first light receiving layer configured to receive blue light;
 a second light receiving layer configured to receive green light; and
 a third light receiving layer configured to receive red light.

7. The unit pixel of claim 6, further comprising a fourth light receiving layer configured to receive infrared.

8. The unit pixel of claim 6, wherein the light receiving part is formed to have a thickness depending on wavelength of light to be detected.

9. The unit pixel of claim 1, wherein the light receiving part is a floating light receiving part and formed of amorphous silicon or polysilicon,
 wherein an electric field generated by electron-hole pairs generated by the incident light occurs in the light receiving part.

10. The unit pixel of claim 9, further comprising a polarization inducing structure formed on the opposite side of the connection between the light receiving part and the floating gate and configured to accelerate recombination of the electron-hole pairs.

11. The unit pixel of claim 1, wherein the light receiving part is a photovoltaic (PV) sensor in which one end of the light receiving part is electrically connected to the floating gate and the other end is connected to a reference voltage.

12. The unit pixel of claim 11, further comprising a reset transistor connected to both ends of the light receiving part and configured to reset the light receiving part.

13. The unit pixel of claim 11, wherein the PV sensor is a PN junction photo diode or a thermopile.

14. The unit pixel of claim 1, wherein the light receiving part is photoconductive (PC) sensor in which one end of the light receiving part is connected to the floating gate and the other end is electrically connected to a constant current source or a constant voltage source.

15. The unit pixel of claim 14, wherein the light receiving part is a thermistor or a bolometer and is electrically connected to the constant current source.

16. The unit pixel of claim 14, wherein the light receiving part is a reverse bias PN junction photo diode and is electrically connected to the constant voltage source.

17. The unit pixel of claim 16, further comprising
 a capacitor connected to the floating gate and the light receiving part, configured to accumulate electric charges outputted from the light receiving part, and configure to apply the voltage to the gate based on the accumulated electric charge; and
 a reset transistor configured to reset the capacitor.

18. The unit pixel of claim 14, wherein the light receiving part is arranged to be spaced apart from the surface of the image sensor.

19. A unit pixel formed on a substrate and configured to convert incident light to an electrical signal to constitute an image sensor, comprising:
 a source having a source voltage supplied thereto and having a silicide layer for metal contact formed thereabove;
 a drain spaced apart from the source and having a silicide layer for metal contact formed thereabove;
 a channel formed between the source and the drain and having a current flowed therethrough;
 an insulating layer formed above the channel;
 a light receiving part placed in a light receiving region of the surface of the image sensor and having changes in electrical properties caused by incident light therein; and
 a floating gate formed above the insulating layer so as to be placed between the source and the drain, configured to be electrically connected with the light receiving part, and configured to control an amount of current flowing through the channel by an electric field generated by the changes in electrical properties,
 wherein the light receiving part is formed of pyroelectric in which one end of the light receiving part is electrically connected to the floating gate and the other end is connected to a reference voltage.

20. A unit pixel formed on a substrate and configured to convert incident light to an electrical signal to constitute an image sensor, comprising:
 a light receiving transistor configured to output a pixel current by the incident light; and
 a select transistor configured to control output of the pixel current, wherein the light receiving transistor comprises:
a source having a source voltage supplied thereto and having a silicide layer for metal contact formed thereabove;
a drain spaced apart from the source and having a silicide layer for metal contact formed thereabove;
a channel formed between the source and the drain and having a current flowed therethrough;
an insulating layer formed above the channel;
a light receiving part placed in a light receiving region of the surface of the image sensor and having changes in electrical properties caused by incident light therein; and
a floating gate formed above the insulating layer so as to be placed between the source and the drain, configured to be electrically connected with the light receiving part, and configured to control an amount of current flowing through the channel by an electric field generated by the changes in electrical properties,
wherein the light receiving transistor is PMOS formed in an N-well formed in the substrate, and
wherein the light receiving transistor further comprises a reset end formed in the N-well and configured to receive a signal.

21. The unit pixel of claim 20, wherein the light receiving transistor further comprises an N-well bias end formed in the N-well and configured to receive an N-well bias voltage.

22. The unit pixel of claim 20, further comprising a reset transistor having a source, a drain that are connected to each end of the light receiving part respectively, and a gate that receives a reset signal,
wherein the reset transistor shorts the light receiving part when the reset signal is inputted.

* * * * *